United States Patent
Suhara

[19]

[11] Patent Number: 6,108,900
[45] Date of Patent: Aug. 29, 2000

[54] CIRCUIT COMPONENT MOUNTING SYSTEM

[75] Inventor: Shinsuke Suhara, Kariya, Japan

[73] Assignee: Fuji Machine Mfg. Co., Ltd., Chiryu, Japan

[21] Appl. No.: 09/020,948

[22] Filed: Feb. 9, 1998

[30] Foreign Application Priority Data

Feb. 24, 1997 [JP] Japan ................................. 9-038842

[51] Int. Cl.[7] .................................................. B23P 19/00
[52] U.S. Cl. ............................. 29/739; 29/711; 29/740; 29/741; 29/743
[58] Field of Search .............................. 29/739, 740, 741, 29/743, 832, 706, 707, 711, 714, 715

[56] References Cited

FOREIGN PATENT DOCUMENTS 61-140412  6/1986  Japan .
B2 63-61133  11/1988  Japan .
B22-49560  10/1990  Japan .

Primary Examiner—Jessica J. Harrison
Assistant Examiner—Binh-An Nguyen
Attorney, Agent, or Firm—Oliff & Berridge, PLC

[57] ABSTRACT

A system for mounting circuit components on a circuit substrate, including a circuit-substrate supporting device which supports the circuit substrate, a circuit-component mounting device which mounts, at a circuit-component mounting position, the circuit components on the circuit substrate supported by the circuit-substrate supporting device, and a circuit-substrate carry-out device which receives, from the circuit-substrate supporting device, the circuit substrate with the circuit components being mounted thereon, and carries out the received circuit substrate, the circuit substrate being transferred from the circuit-substrate supporting device to the circuit-substrate carry-out device in a direction substantially perpendicular to a plane of the circuit substrate.

34 Claims, 15 Drawing Sheets

6,108,900

CIRCUIT COMPONENT MOUNTING SYSTEM

BACKGROUND OF THE INVENTION

1. Field of the Invention

The present invention relates to a system and a method for mounting circuit components ("CCs") on a circuit substrate ("CS").

2. Related Art Statement

FIG. 14 shows a known CC mounting system 500 including a CS supporting device 512 which supports a CS 520, 521; a CC mounting device (not shown) which mounts, at a CC mounting position, CCs on the CS 520, 521 supported by the CS supporting device 512; a CS carry-in device 514 which carries in the CS 520, 521 and transfers the CS 520, 521 to the CS supporting device 512; and a CS carry-out device 516 which receives, from the CS supporting device 512, the CS 520, 521 on which the CCs have been mounted, and carries out the CS 520, 521. The CS carry-in and carry-out devices 514, 516 are provided along a CS carrying route on which the CS 520, 521 is carried, and the CC mounting device is provided at the CC mounting position offset from the CS carrying route. The CC supporting device 512 includes a main holding device 518 which holds the CS 520, 521, and a main-holding-device moving device which moves the main holding device 518 horizontally and vertically. Thus, the CS 520, 521 held by the main holding portion 518 is horizontally moved between the CC mounting position where the CCs are mounted on the CS 520, 521 by the CC mounting device and a CS transferring position where the CS 520, 521 is transferred from the CS carry-in device 514 and to the CS supporting device 512, and is transferred from the CS supporting device 512 to the CS carry-out device 516, and where the CS 520, 521 is vertically moved between a movement height position where the CS 520, 521 is moved for the CCs to be mounted thereon and a transferring height position where the CS 520, 521 is transferred between the CS supporting device 512 and the CS carry-in and carry-out devices 514, 516.

In the first step shown in FIG. 14, the CS 520 is carried in by the CS carry-in device 514; and, in the second step, the CS 520 is transferred to, and held by, the main holding device 518 being positioned at the CS transferring position and the transferring height position, while the CS 520 is moved in a direction (i.e., horizontal direction) substantially parallel to the plane of the CS 520. In the third step, the main holding device 518 holding the CS 520 is lowered to the movement height position and then is horizontally moved to the CC mounting position where the CCs are mounted on the CS 520. In the second step, the CS 521 on which the CCs have been mounted is transferred, at the CS transferring position and the transferring height position, to the CS carry-out device 516, while the CS 521 is moved in the horizontal direction. Thus, the CS 520 is transferred from the CS carry-in device 514 to the CS supporting device 512, while the CS 521 is concurrently transferred from the CS supporting device 512 to the CS carry-out device 516. This CS transferring operation (i.e., the transferring of the CS 520 onto the CS supporting device 512 and the transferring of the CS 521 from the same 512) needs a long time of about 5 seconds, as illustrated in FIG. 15. In particular, it is difficult to accelerate the transferring of the CS 521 from the CS supporting device 512 to the CS carry-out device 516. Meanwhile, if the acceleration and/or deceleration of movement of the CS 521 are/is increased to solve this problem, the CCs mounted on the CS 521 might move because the CCs have only temporarily been fixed to the CS 521 with solder paste or uncured adhesive.

SUMMARY OF THE INVENTION

It is therefore an object of the present invention to provide a circuit component mounting system which enjoys improved operation efficiency.

It is another object of the present invention to provide a circuit component mounting method which enjoys improved operation efficiency.

The present invention provides a circuit component mounting system and a circuit component mounting method which have one or more of the technical features which are described below in respective paragraphs given parenthesized sequential numbers (1) to (44). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a system for mounting circuit components on a circuit substrate, comprising a circuit-substrate supporting device which supports the circuit substrate; a circuit-component mounting device which mounts, at a circuit-component mounting position, the circuit components on the circuit substrate supported by the circuit-substrate supporting device; and a circuit-substrate carry-out device which receives, from the circuit-substrate supporting device, the circuit substrate with the circuit components being mounted thereon, and carries out the received circuit substrate, wherein the circuit substrate is transferred from the circuit-substrate supporting device to the circuit-substrate carry-out device in a first direction substantially perpendicular to a plane of the circuit substrate. In the present CC (circuit component) mounting system, the transferring, i.e., removing of the CS (circuit substrate) from the CS supporting device to the CS carry-out device is done in the first direction substantially perpendicular to the plane of the CS, that is, in the direction of thickness of the CS. Accordingly, the present system can remove the CS in a time shorter than in the case where the CS would be removed in a parallel direction parallel to the plane of the CS. If the removing of the CS from the CS supporting device is done in the first direction, the CS may be mounted on the CS supporting device by being moved in the parallel direction, because the overall time needed for mounting and removing the CS can be reduced. If the time needed for removing a CS is reduced in a CC mounting system of a type in which the mounting of the CS and the removing of the CS are done at different times, it is natural that the overall time needed for mounting and removing the CS should be reduced. In addition, if the time needed for removing a CS is reduced in a CC mounting system of another type, like the prior CC mounting system shown in FIG. 14, in which the removing of the CS and the mounting of another CS are done concurrently, the time needed for mounting the second CS can be reduced because the second CS can be moved in the parallel direction at a higher speed for being mounted on the CS supporting device. In either case, the present CC mounting system can reduce the time during which the CS supporting device is involved in receiving and transferring the CS, which leads to increasing the ratio of the time during which the CS supporting device is involved in the mounting of the CCs on the CS, to the entire operation time of the CS supporting device.

Thus, the present CC mounting system can enjoy improved operation efficiency.

(2) According to a second feature of the present invention which includes the first feature (1), the circuit-substrate carry-out device comprises a removing device which removes, from the circuit-substrate supporting device, the circuit substrate with the circuit components being mounted thereon, at a circuit-substrate removing position, in the first direction; and a parallel-direction carry-out device which receives the circuit substrate removed by the removing device, and carries out the received circuit substrate by moving the received circuit substrate in a parallel direction substantially parallel to the plane of the circuit substrate. The removing of the CS and the parallel-direction movement of the CS may be done by a single device. However, in the case where the CS is moved over a long distance in the parallel direction, it is preferred that the removing of the CS and the parallel-direction movement of the CS be done by independent devices, respectively. In the latter case, the CS supported by the CS supporting device is not directly transferred to the parallel-direction carry-out device, but is removed by the removing device before being transferred to the parallel-direction carry-out device. Since the CS is temporarily kept or held by the removing device, the removing device may be called as the CS temporarily keeping or holding device. The transferring of the CS from the removing device to the parallel-direction carry-out device may be done in the first direction or in the parallel direction. In the case where the removing device includes the holding device according to the fourteenth feature (14), the CS is transferred in the parallel direction. Since the CS supporting device is not involved in this transferring of the CS, the transferring of the CS may not be done immediately after the removing of the CS from the CS supporting device. For example, the transferring of the CS may be done concurrently with an operation in which the CS supporting device is involved, such as the mounting of another CS on the CS supporting device, or the mounting of CCs on the second CS.

(3) According to a third feature of the present invention which includes the first or second feature (1) or (2), the circuit-substrate carry-out device comprises a parallel-direction carry-out device which carries out the circuit substrate by moving the circuit substrate in a parallel direction substantially parallel to the plane of the circuit substrate; and a removing device which removes, from the circuit-substrate supporting device, the circuit substrate with the circuit components being mounted thereon, at a circuit-substrate removing position, in the first direction, and transfers the removed circuit-substrate to the parallel-direction carry-out device at a circuit-substrate transferring position in the parallel direction. The CS removing position and the CS transferring position may be the same as, or different from, each other. In the case where the two positions are different from each other, the removing device may include a holding device which removes the CS from the CS supporting device and holds the same, and a holding-device moving device which moves the holding device between the two positions. In the case where the two positions are the same as each other, the removing device does not need any holding-device moving device. In the case where the CS supporting device includes a main holding device which holds a CS and a main-holding-device moving device which moves the holding device, the removing device may be adapted to wait, at the CS removing position, in a state thereof in which the removing device can remove a CS from the CS supporting device, so that the removing device can quickly remove the CS from the CS supporting device when the CS on which CCs have been mounted is moved to the CS removing position by the CS supporting device. In addition, the removing device may be adapted to wait, at the CS transferring position, in a state thereof in which the removing device can transfer a CS to the parallel-direction carry-out device, so that the removing device can quickly transfer the CS. Thus, the removing device may selectively take the two waiting states in one of which the removing device can quickly remove a CS from the CS supporting device and in the other of which the removing device can quickly transfer a CS to the parallel-direction carry-out device. Each of the parallel-direction carry-out device and the removing device of the CS carry-out device according to the second feature (2), may comprise a holding device which removes a CS from the CS supporting device and holds the same, and may, or may not, include a holding-device moving device which moves the holding device.

(4) According to a fourth feature of the present invention which includes any one of the first to third features (1) to (3), the circuit component mounting system further comprising a circuit-substrate carry-in device which carries in the circuit substrate and transfers the circuit substrate to the circuit-substrate supporting device, wherein the circuit substrate is transferred from the circuit-substrate carry-in device to the circuit-substrate supporting device in a second direction opposite to the first direction. In the present CC mounting system, the removing of the CS from the CS supporting device to the CS carry-out device is done in the first direction, and the transferring, i.e., mounting of the CS from the CS carry-in device to the CS supporting device is done in the second direction opposite to the first direction, that is, perpendicular to the plane of the CS, i.e., in the direction of thickness of the CS. Accordingly, the CS can be mounted on the CS supporting device in a time shorter than in the case where the CS would be mounted by being moved in a parallel direction parallel to the plane of the CS. Since both the removing and mounting of the CS are done in the first and second directions opposite to the plane of the CS, the overall time needed for removing and mounting the CS can be reduced as compared with the case where only the removing of the CS would be done in the first direction and the mounting of the CS would be done in the parallel direction. The present CC mounting system is advantageously used for the case where the CS to which some (not all) CCs have been temporarily fixed is carried in by the CS carry-in device.

(5) According to a fifth feature of the present invention which includes the fourth feature (4), the circuit-substrate carry-in device comprises a third-direction carry-in device which carries in the circuit substrate by moving the circuit substrate to a circuit-substrate mounting position in a third direction substantially parallel to the plane of the circuit substrate; and a mounting device which receives, from the third-direction carry-in device, the circuit substrate moved to the circuit-substrate mounting position, and mounts the received circuit substrate on the circuit-substrate supporting device in the second direction. The description made for the CS carry-out device according to the second feature (2) is also true with the CS carry-in device according to the fifth feature (5). For example, the CS mounting position can be said as the CS transferring position, and the mounting device can be said as the CS temporarily keeping or holding device. In addition, before the CS is mounted on the CS supporting device, the CS is transferred to the mounting device, so that the mounting device may wait while holding the CS.

(6) According to a sixth feature of the present invention which includes the fourth or fifth feature (4) or (5), the circuit-substrate carry-in device comprises a third-direction carry-in device which carries in the circuit substrate by moving the circuit substrate to a waiting position in a third direction substantially parallel to the plane of the circuit substrate; and a mounting device which holds the circuit substrate moved to the waiting position, waits while holding the circuit substrate, and mounts the circuit substrate on the circuit-substrate supporting device at a circuit-substrate mounting position in the second direction. The description made for the CS carry-out device according to the third feature (3) is also true with the CS carry-in device according to the sixth feature (6). For example, in the case where the waiting position and the CS mounting position are different from each other, the mounting device may include a holding device which holds the CS, and a holding-device moving device which moves the holding device. In addition, the mounting device may selectively take two waiting states in one of which the mounting device can quickly receive a CS from the third-direction carry-in device and in the other of which the mounting device can quickly mount a CS on the CS supporting device. Each of the third-direction carry-in device and the mounting device of the CS carry-in device according to the fifth feature (5), may include a holding device which holds a CS, and may, or may not, include a holding-device moving device which moves the holding device.

(7) According to a seventh feature of the present invention which includes any of the fourth to sixth features (4) to (6), at least one of the circuit-substrate carry-out device, the circuit-substrate carry-in device, and the circuit-substrate supporting device comprises a holding device which holds the circuit substrate, and a holding-device moving device which moves the holding device in a third direction substantially parallel to the plane of the circuit substrate. Which one or two, or all, of the CS carry-out device, the CS carry-in device, and the CS supporting device has or have a holding-device moving device in addition to a holding device, depends on the positional relationship between the CC mounting position, the CS mounting position, and the CS removing position. For example, in the case where the CC mounting position is different from the CS mounting position and the CS removing position, it is preferred that the CS supporting device has a main holding device which holds a CS and a main-holding-device moving device which moves the main holding device in the third direction between the CC mounting position and the CS mounting and removing positions. In this case, the main holding device may be attached to the main-holding-device moving device, which may be provided by an X-Y table which is movable in an X direction and a Y direction perpendicular to the X direction. In the case where the CC mounting position is the same as both the CS mounting and removing positions, it is possible that the CS carry-in device has a holding device which holds a CS and a holding-device moving device which moves the holding device in the third direction over at least a portion of the distance between a CS supplying position where the CS is supplied and the CC mounting position and that the CS carry-out device have a holding device which holds a CS and a holding-device moving device which moves the holding device in the third direction over at least a portion of the distance between the CC mounting position and a CS discharging position where the CS on which the CCs have been mounted is discharged. In the case where the CC mounting position is the same as one of the CS mounting and removing positions and is different from the other position, it is possible that the CS supporting device have a main holding device and a main-holding-device moving device and that one of the CS carry-in device and the CS carry-out device have a holding device and a holding-device moving device.

(8) According to an eighth feature of the present invention which includes any of the fourth to seventh features (4) to (7), the circuit-substrate carry-in device and the circuit-substrate carry-out device are provided along a circuit-substrate carrying route, wherein the circuit-component mounting device is provided at the circuit-component mounting position offset from the circuit-substrate carrying route, wherein the circuit-substrate carry-in device comprises a mounting device which mounts, at a circuit-substrate mounting position on the circuit-substrate carrying route, the circuit substrate on the circuit-substrate supporting device in the second direction, wherein the circuit-substrate carry-out device comprises a removing device which removes, at a circuit-substrate removing position on a downstream side of the circuit-substrate mounting position on the circuit-substrate carrying route, the circuit substrate from the circuit-substrate supporting device in the first direction, and wherein the circuit-substrate supporting device comprises a main holding device which holds the circuit substrate, and a main-holding-device moving device which moves the main holding device to the circuit-component mounting position, the circuit-substrate mounting position, and the circuit-substrate removing position. In the present CC mounting system, the CS is mounted on the main holding device of the CS supporting device in the second direction. The main holding device which holds the mounted CS is moved by the main-holding-device moving device from the CS mounting position to the CC mounting position where the CCs are mounted on the CS. After the CCs have been mounted on the CS, the main holding device is moved by the main-holding-device moving device to the CS removing position where the CS is removed in the first direction by the CS removing device. After the CS is removed, the main holding device is moved back to the CS mounting position where another CS is mounted thereon. Thus, in the case where the CC mounting position, the CS mounting position, and the CS removing position are different from one another, the main holding device of the CS supporting device is moved among those positions by the main-holding-device moving device. Since the CS mounting position and the CS removing position are distant from each other, the CS mounting device and the CS removing device can be operated while being effectively prevented from interfering with each other. For example, while a CS is removed at the CS removing position, the CS mounting device which holds another CS may be moved to the CS mounting position and wait. In this case, immediately after the first CS is removed at the CS removing position, the main holding device may be moved to the CS mounting position where the CS mounting device mounts the second CS on the CS supporting device in the second direction. Thus, the overall time needed for mounting and removing each CS can be reduced. Since the main holding device is moved from the CS removing position to the CS mounting position, without holding a CS, the main holding device can be quickly moved with an abrupt acceleration and/or an abrupt deceleration. In the prior CC mounting system shown in FIG. 14, the main holding device 518 need not be moved in the CS carrying direction, but the CS must be moved in a direction parallel to the plane thereof. As described previously, this movement of the CS needs a long time. In contrast, the CC mounting system according to the eighth feature (8) requires the movement of the main holding device. However, this movement can be quickly done and accordingly the overall time needed for mounting and removing each CS can be reduced.

(9) According to a ninth feature of the present invention which includes any of the fourth to eighth features (4) to (8), the circuit-substrate carry-in device and the circuit-substrate carry-out device are provided along a circuit-substrate carrying route, wherein the circuit-component mounting device is provided at the circuit-component mounting position offset from the circuit-substrate carrying route, and wherein the circuit-substrate supporting device comprises a main holding device which holds the circuit substrate, and a main-holding-device moving device which moves the main holding device in at least a direction which is substantially parallel to the plane of the circuit substrate and which intersects the circuit-substrate carrying route.

(10) According to a tenth feature of the present invention which includes any of the fourth to ninth features (4) to (9), the circuit component mounting system comprises a circuit-substrate transferring device which transfers the circuit substrate in the first direction. For example, the CS transferring device comprises a first portion supported by the CS supporting device and a second portion supported by the CS carry-out device, or comprises a first portion supported by the CS supporting device and a second portion supported by the CS carry-in device. That is, the CS transferring device may comprise a main holding device of the CS supporting device and a holding device of the CS carry-out device, or comprise a main holding device of the CS supporting device and a holding device of the CS carry-in device. For example, in the case where the CS carry-out device includes the removing device and the third-direction carry-out device or the the CS carry-in device includes the third-direction carry-in device and the mounting device, the CS transferring device may comprise the holding device of the removing device or the holding device of the mounting device. Otherwise, the CS transferring device may comprise a support member which just supports the lower surface of the CS.

(11) According to an eleventh feature of the present invention which includes the tenth feature (10), the is circuit-substrate transferring device comprises at least one of a clamping device which clamps the circuit substrate, a support member which supports a lower surface of the circuit substrate, and a suction device which holds the circuit substrate by applying suction thereto. In the case where each of the CS supporting device and the CS carry-out device or the CS carry-in device comprises one of the clamping device, the support member, and the suction device, the CS can be transferred from the CS supporting device to the CS carry-out device in the first direction, or from the CS carry-in device to the CS supporting device in the second direction. This feature is equivalent to a feature that the holding device according to the seventh feature (7) comprises one of the clamping device, the support member, and the suction device. Meanwhile, the suction device may be either an upper-surface suction device which holds a CS by applying suction to the upper surface of the CS, or a lower-surface suction device which holds a CS by applying suction to the lower surface of the CS. However, in the case where the main holding device of the CS supporting device employs a suction device, it is preferred that the main holding device employs a lower-surface suction device. The CS transferring device may be provided by the combination of a clamping device and a support member, the combination of a support member and a suction device, or the combination of two suction devices. That is, the CS transferring device may be provided by the combination of two holding devices of different sorts, or the combination of two holding devices of the same sort.

(12) According to a twelfth feature of the present invention which includes any one of the fourth to eleventh features (4) to (11), at least one of the circuit-substrate carry-out device, the circuit-substrate carry-in device, and the circuit-substrate supporting device comprises a holding device which holds the circuit substrate, and wherein the holding device comprises a pivot-type holding device comprising at least one main portion, and at least one pivotable portion which is supported by the main portion such that the pivotable portion is pivotable to a holding position where the pivotable portion supports a lower surface of the circuit substrate and thereby holds the circuit substrate, and to a releasing position where the pivotable portion releases the circuit substrate, about an axis line substantially parallel to the plane of the circuit substrate. It is preferred that the pivot-type holding device comprise a pair of main portions and a pair of pivotable portions which are supported by the two main portions such that the two pivotable portions are opposed to each other. The switching of the pivot-type holding device between its holding and releasing positions is done by pivoting the pivotable portions. Otherwise, it is possible that the holding device comprise a translate-type holding device including at least one translateable portion which can be translated for holding and releasing the CS. However, the pivot-type holding device can be produced more easily than the translate-type holding device. The pivot-type holding device may comprise a plurality of holding projections which cooperate with each other to support the lower surface of the CS. The plurality of rotatable support members according to the thirteenth feature (13) can be regarded as one embodiment of the plurality of holding projections, or otherwise it can be said that the plurality of rotatable support members according to the thirteenth feature (13) are supported by the plurality of holding projections, respectively. In the case where the CS carry-in device comprises the pivot-type holding device and the main holding device of the CS supporting device comprises the support member which supports the lower surface of the CS, the transferring of the CS means that the pivot-type holding device is switched from its CS holding state to its CS releasing state and the CS is released from the pivot-type holding device and is supported on the support member. The releasing of the CS from the pivot-type holding device may be done after or before the CS is supported on the support member. In the latter case, the CS falls onto the support member and accordingly it is preferred that the distance of falling of the CS be as short as possible. The pivot-type holding device may comprise a CS moving device which moves the CS being held, in a horizontal direction. For example, the CS moving device may be provided by a plurality of rollers, and a belt wound on the rollers. The CS is held by the belt and is moved horizontally by the rotation of the rollers. The CS moving device may comprise the plurality of rotatable support members according to the thirteenth feature (13).

(13) According to a thirteenth feature of the present invention which includes the twelfth feature (12), the at least one pivotable portion of the pivot-type holding device comprises at least one pivotable member which is attached to the at least one main portion such that the pivotable member is pivotable about an axis line thereof; and a plurality of rotatable support members which are attached to the pivotable member such that the rotatable support members are arranged along a straight line parallel to the axis line of the pivotable member and each of the support members is rotatable about an axis line perpendicular to the axis line of the pivotable member. Since the pivotable portion comprises the plurality of rotatable support members arranged along the straight line parallel to the axis line of the pivotable member, the support members cooperate with each other to support the CS such that the CS extends parallel to the axis line of the pivotable member. In addition, when the support members are rotated, the CS is moved in the third direction parallel to the plane of the CS. For example, in the case where the CS carry-in device comprises the third-direction carry-in device and the mounting device according to the fifth or sixth feature (5) or (6) and the mounting device comprises the pivot-type holding device including the at least one pivotable member and the plurality of rotatable support members, the third-direction carry-in device carries in the CS in the third direction and the pivot-type holding device can receive the CS in the third direction by utilizing the rotation of the rotatable support members. Meanwhile, in the case where the CS carry-out device comprises the parallel-direction carry-out device and the removing device according to the second or third feature (2) or (3) and the removing device comprises the pivot-type holding device including the at least one pivotable member and the plurality of rotatable support members, the removing device can transfer the removed CS to the parallel-direction carry-out device in the parallel direction by utilizing the rotation of the rotatable support members.

(14) According to a fourteenth feature of the present invention which includes any one of the first to thirteenth feature (1) to (13), at least one of the circuit-substrate carry-out device and the circuit-substrate supporting device comprises a holding device which holds the circuit substrate, and wherein the holding device comprises at least one main member; at least one pivotable member which is supported by the main member such that the pivotable member is pivotable about an axis line substantially parallel to the plane of the circuit substrate; a plurality of rotatable support members which are attached to the pivotable member such that the rotatable support members are arranged along a straight line parallel to the axis line of the pivotable member and each of the support members is rotatable about an axis line perpendicular to the axis line of the pivotable member; and a pivoting device which pivots the pivotable member to a holding position where the rotatable support members support the circuit substrate, and to a releasing position where the support members release the circuit substrate. In the case where the present CC mounting system comprises a CS carry-in device in addition to the CS carry-out device and the CS supporting device, it is preferred that at least one of the CS carry-in device, the CS carry-out device, and the CS supporting device comprise the above-described holding device. In the present CC mounting system, the holding device which holds the CS can be switched by pivoting the pivotable member to its CS holding position and its CS releasing position. This holding device can be produced more easily than a holding device of a type which is switchable by translating at least one member to its CS holding and releasing positions. Since this holding device is switchable to its CS holding and releasing states by the switching of the pivotable member to its CS holding and releasing positions, the holding device can be called as the pivot-type holding device. Since the CS is supported on the rotatable support members as a plurality of holding projections, the CS extends parallel to the axis line of the pivotable member. When the rotatable support members on which the CS is supported are rotated, the CS is moved in the parallel or third direction parallel to the plane of the CS. That is, the CS is supported on the rotatable support members such that the CS is movable in the third direction. Thus, the rotatable support members function as a CS moving device which moves the CS in the third direction. The third direction may be a horizontal direction.

(15) According to a fifteenth feature of the present invention which includes the thirteenth or fourteenth feature (13) or (14), the pivot-type holding device further comprises a rotating device which rotates the rotatable support members, and wherein each of the rotatable support members includes a roller portion which contacts and supports the circuit substrate, and a friction ring defining an outer circumferential surface of the roller portion. The CS is supported on the rotatable support members such that the CS is in contact with the respective friction rings of the support members. The friction rings contribute to increasing the friction force produced between the CS and the rotatable support members. Thus, the rotation of the roller portions are advantageously transmitted to the CS, so that the CS may be moved in the third direction.

(16) According to a sixteenth feature of the present invention which includes the fifteenth feature (15), the rotating device comprises a plurality of driven pulleys each of which is attached to a portion of a corresponding one of the rotatable support members which portion is axially remote from the roller portion of the one rotatable support member; at least one guide pulley which is rotatably attached to the pivotable member such that the guide pulley is positioned in a plane in which the driven pulleys are positioned; a drive source which is attached to the pivotable member and which produces rotation; a drive pulley which is attached to the drive source such that the drive pulley is positioned in the plane; and a rotation transmitting member which is wound on the drive pulley, the driven pulleys, and the guide pulley. The drive pulley is rotated by the drive source, the rotation of the drive pulley is transmitted by the rotation transmitting member to the driven pulleys, and the respective roller portions of the rotatable support members are rotated. The guide pulley may be used to deflect the rotation transmitting member (e.g., belt), or increase the angle at which the rotation transmitting member is wound on the drive and/or driven pulleys. In the case where the rotating device employs a number of driven pulleys and/or a number of guide pulleys, some of those pulleys may be provided by pulleys having annular flanges and the other pulleys may be provided by pulleys having no annular flange. In this case, the rotation transmitting member is easily wound on those pulleys, while being effectively prevented from being coming off the same during its operation.

(17) According to a seventeenth feature of the present invention which includes any one of the eleventh to sixteenth feature (11) to (16), the circuit-substrate transferring device comprises the clamping device, wherein the clamping device comprises at least one main member; a plurality of clamp members which are attached to the main member such that the clamp members are spaced from each other in a direction substantially parallel to the plane of the circuit substrate, and each of which is pivotable to a clamping position where the each clamp member clamps the circuit substrate, and to a non-clamping position where the each clamp member does not clamp the circuit substrate; and a pivoting device which pivots the clamp members to the clamping and non-clamping positions thereof. Since the CS is clamped by the plurality of clamp members which are provided at an appropriate interval of distance in the parallel direction parallel to the plane of the circuit substrate, e.g., in a horizontal direction, the CS extends in the parallel direction or in the horizontal direction. The main member of the clamping device may be provided by a comb-like member having a plurality of teeth on which the plurality of clamp members are provided, respectively. In the latter case, not only the clamp members but also the teeth of the main member are permitted to enter the recesses of the pivotable member of the pivot-type holding device according to the twenty-first feature (21) described later.

(18) According to an eighteenth feature of the present invention which includes the seventeenth feature (17), the pivoting device comprises an axis member which is rotatable; and a plurality of rotation transmitting devices each of which transmits the rotation of the axis member to a corresponding one of the clamp members. When the single axis member is rotated, the plurality of clamp members are simultaneously pivoted to their clamping and non-clamping positions. Thus, the present CC mounting system enjoys the advantage that the single axis member can be rotated by a single drive source. In addition, the single axis member may be provided at a position distant from the clamp members, so as not to interfere with the operation of the pivotable portion of the pivot-type holding device. The rotation transmitting devices may be provided at positions where those devices do not interfere with the holding projections of the pivotable portion. Each rotation transmitting device may be provided by, e.g., a drive gear attached to the axis member such that the drive gear is not rotatable relative to the axis member, and a plurality of driven gears such as sector gears which are provided on the plurality of clamp members such that the driven gears are rotatable with the clamp members and each of which is directly meshed with, or indirectly meshed via an intermediate gear, with the drive gear.

(19) According to a nineteenth feature of the present invention which includes any one of the twelfth to eighteenth features (12) to (18), at least one of the circuit-substrate carry-in device and the circuit-substrate carry-out device comprises the pivot-type holding device, and wherein the circuit-substrate supporting device comprises a main holding device which holds the circuit substrate and the main holding device comprises a clamping device which clamps the circuit substrate. In the case where the CS supporting device further includes a main-holding-device moving device which moves the main holding device in the third direction and the CS carry-in and carry-out devices do not have any holding-device moving devices, it is desirable that the main holding device reliably hold the CS than the respective holding devices of the CS carry-in and carry-out devices. In addition, since the CCs are mounted on the CS held by the main holding device, it is also desirable that the main holding device reliably hold the CS. On the other hand, in order to facilitate the removing of the CS in the first direction and/or the mounting of the CS in the second direction, it is desirable that one of the CS supporting device and the CS carry-out or carry-in device employ the pivot-type holding device. Therefore, it is desirable that at least one of the CS carry-in device and the CS carry-out device comprise the pivot-type holding device and that the main holding device comprise the clamping device.

(20) According to a twentieth feature of the present invention which includes the nineteenth feature (19), the pivot-type holding device holds at least one first portion of an outer peripheral portion of the circuit substrate, and the clamping device clamps at least one second portion of the outer peripheral portion of the circuit substrate which is different from the first portion. For example, the CS can be transferred between the main holding device and the holding device of the CS carry-out or carry-in device, in such a manner that a plurality of clamp members of the clamping device are positioned alternately with a plurality of holding projections of the holding device. That is, if the clamping positions and the holding positions are alternate with each other on the CS, the CS can be simultaneously clamped and held and can be smoothly changed to its clamped state and its held state. The switching of the clamping device between its CS clamping and non-clamping states and the switching of the holding device between its CS holding and releasing states can be simultaneously done while the clamp members and the holding projections are prevented from interfering with each other. Thus, the CS can be smoothly transferred. For example, the CS may be handed from the clamping device to the holding device, or vice versa, without any movement thereof in the first or second direction, or with only small movement thereof in the first or second direction. This CS handing may be done only between the CS carry-out device and the CS supporting device, or only between the CS carry-in device and the CS supporting device, or both between the CS carry-out device and the CS supporting device and between the CS carry-in device and the CS supporting device.

(21) According to a twenty-first feature of the present invention which includes any one of the thirteenth to twentieth features (13) to (20), the at least one pivotable member of the pivot-type holding device has a plurality of recesses formed in a plurality of first portions thereof, respectively, which are different from a plurality of second portions thereof to which the plurality of rotatable support members are attached, respectively. The recesses may have a shape and dimensions which permit the clamp members of the clamping device to move thereinto. In the case where the pivot-type holding device employs two pivotable members, the shape of each recess may be such that with the pivotable members being at their holding positions, each recess opens in the lower surface of the corresponding pivotable member and the inner surface of the same which is opposed to the inner surface of the other pivotable member. In the case where the recesses are alternate with the rotatable support members, the clamping positions and the holding positions are also alternate on the CS. Otherwise, each recess may have such a shape that the recess opens in the lower surface of the pivotable member and in both the side surfaces of the same. In the last case, the pivotable member has a comb-like shape. The rotatable support members may be replaced with the holding projections.

(22) According to a twenty-second feature of the present invention which includes the nineteenth or twentieth feature (19) or (20), the clamping device comprises at least one support member which supports a lower surface of the circuit substrate, and a plurality of clamp members which clamp the circuit substrate and which are attached to a plurality of first portions of the support member, respectively, wherein the at least one pivotable portion of the pivot-type holding device comprises a plurality of holding projections which cooperate with each other to hold the circuit substrate, and wherein the support member further includes a plurality of second recessed portions which are different from the first portions thereof and which permit the holding projections to move thereinto to hold the circuit substrate. It is desirable that the clamping device also comprise the second recessed portions which permit the holding projections (or the rotatable support members) of the pivotable portion to move thereinto. In the case where the clamp members are provided at an appropriate interval of distance, those clamp members may cooperate with each other to define the second recessed portions.

(23) According to a twenty-third feature of the present invention which includes any one of the fourth to twenty-second feature (4) to (22), at least one of the circuit-substrate carry-out device, the circuit-substrate carry-in device, and the circuit-substrate supporting device comprises a holding device which holds the circuit substrate, and an elevating and lowering device which moves the holding device upward and downward. The holding device may not be movable upward or downward. However, in the case where at least one of the above-indicated three devices comprises the elevating and lowering device, for example, the distance of falling of the CS when the CS is transferred in the second direction can be reduced or even zeroed. It is desirable that the CS do not fall when the CS is transferred in the second direction, in particular in the case where the CS has some CCs mounted thereon. Meanwhile, in the case where at least two of the CS mounting height position, the CC mounting height position, the CS removing height position, and the horizontal-movement height position of the CS supporting device are different from each other, in the case where at least two of the CS carry-in height position, the waiting height position, and the CS mounting height position of the CS carry-in device are different from each other, or in the case where at least two of the CS carry-out height position, the CS transferring height position, and the CS removing height position of the CS carry-out device are different from each other, each of the above-indicated three devices needs the elevating and lowering device. In addition, in the case where after the CS is transferred from one holding device to another holding device, one of the two holding devices interferes with the horizontal movement of the other holding device, the elevating and lowering device is needed for moving one of the two holding devices upward or downward. For example, in the case where the CS carry-in device comprises the third-direction carry-in device and the mounting device, if the CS receiving height position where the mounting device receives the CS carried in by the carry-in device is different from the CS mounting height position where the mounting device mounts the CS on the CS supporting device, it is desirable that the mounting device comprise the holding device and the elevating and lowering device. Likewise, in the case where the CS removing height position and the CS transferring height position of the removing device are different from each other, it is desirable that the removing device comprise the holding device and the elevating and lowering device. In the case where the CS transferring (mounting or removing) height position, the CC mounting height position, and the horizontal-movement height position of the CS supporting device are different from each other, it is desirable that the CS supporting device comprise the main holding device and the elevating and lowering device which moves the main holding device upward and downward. In the case where each of the mounting device, the removing device, and the CS supporting device comprises the elevating and lowering device which elevates and lowers the CS in the first and second directions, and each of the three elevating and lowering devices comprises a speed control device which controls the speed of upward and downward movement of the holding device, the holding device can be moved upward and downward in such a controlled manner that the holding device holding a CS is moved at a low speed and that the holding device not holding any CSs is moved at a high speed. In the case where each elevating and lowering device comprises a distance control device which controls the distance of upward and downward movement of the holding device, the holding device can be moved upward and downward in such a controlled manner that the holding device holding a CS is moved by a short distance and that the holding device not holding any CSs is moved by a long distance. In addition, the main holding device and the holding device of the CS carry-in or carry-out device can be moved in such a controlled manner that the main holding device is elevated and lowered by a short distance and that the holding device of the CS carry-in or carry-out device is elevated and lowered by a long distance. Although the time needed for elevating and lowering the main holding device is included in the overall time needed for mounting and removing each CS, the main holding device is not involved in the upward and downward movement of the holding device of the CS carry-in or carry-out device. Accordingly, this movement may be done concurrently with another operation. Thus, the holding device of the CS carry-in or carry-out device may be elevated and lowered by a distance longer than that by which the main holding device is elevated and lowered. For example, when the removing device removes the CS from the CS supporting device at the CS removing position, the distance of upward movement of the main holding device holding the CS may be reduced by making the holding device of the removing device to wait at the CS removing height position, even if the main holding device may be moved upward at a low speed. After the removing of the CS, the holding device holding the removed CS may be moved upward to the CS transferring height position at a low speed and the main holding portion not holding a CS may be moved downward to the horizontal-movement height position at a high speed. However, the upward movement of the holding device of the removing device need not be started immediately after the removing of the CS, and may be done concurrently with the carrying-in of another CS, the mounting of the second CS, and/or the mounting of CCs on the second CS. Meanwhile, when the mounting device mounts the CS on the CS supporting device at the CS mounting position, the holding device of the mounting which is held at its CS holding state may be moved downward from the CS receiving height position to the CS mounting height position at a low speed, and the main holding device not holding a CS may be moved upward from the horizontal-movement height position to the CS mounting height position. After the mounting of the CS, the holding device of the mounting device which is held at its CS releasing state may be moved upward to the CS receiving height position at a high speed, and the main holding device may be moved in the horizontal direction immediately.

(24) According to a twenty-fourth feature of the present invention which includes the twenty-third feature (23), the elevating and lowering device comprises a control device including a speed control device which controls a speed of the upward and downward movement of the holding device such that the speed of the movement is smoothly increased when the movement is started, and is smoothly decreased when the movement is stopped. In this case, the CS can be transferred with reduced impact. It is desirable that 20 the speed control device control the speed of upward and downward movement of the holding device such that the speed is smoothly increased from zero and is smoothly decreased. In the last case, the CS can be transferred with reduced vibration and noise.

(25) According to a twenty-fifth feature of the present invention which includes the twenty-third or twenty-fourth feature (23) or (24), the holding device comprises a pivot-type holding device comprising at least one main portion, and at least one pivotable portion which is supported by the main portion such that the pivotable portion is pivotable to a holding position where the pivotable portion supports a lower surface of the circuit substrate and thereby holds the circuit substrate, and to a releasing position where the pivotable portion releases the circuit substrate, about an axis line substantially parallel to the plane of the circuit substrate, and wherein the elevating and lowering device comprises a speed control device which controls a speed of the upward and downward movement of the holding device such that the speed of the movement is smoothly increased when the movement is started, and is smoothly decreased when the movement is stopped. It is desirable that the speed control device be used in combination with the pivot-type holding device.

(26) According to a twenty-sixth feature of the present invention which includes the twenty-fourth or twenty-fifth feature (24) or (25), the elevating and lowering device comprises at least one main member, and wherein the speed control device comprises at least one rotatable axis member which is supported by the main member such that the axis member is rotatable at a constant speed; and a motion converting device which converts the constant-speed rotation of the axis member into the upward and downward movement of the holding device such that the speed of the movement is smoothly increased from zero and is smoothly decreased.

(27) According to a twenty-seventh feature of the present invention which includes the twenty-sixth feature (26), the elevating and lowering device further comprises at least one elevating and lowering member which holds the holding device, and wherein the motion converting device comprises at least one eccentric cam which is attached to the rotatable axis member such that the eccentric cam is eccentric to the axis member; and at least one elongate groove which is formed in the at least one elevating and lowering member such that the elongate groove is elongate in a third direction substantially parallel to the plane of the circuit substrate, and which is engaged with the at least one eccentric cam such that the elongate groove is substantially immovable relative to the eccentric cam in a vertical direction. As the eccentric cam is rotated, the elevating and lowering member is moved upward and downward, so that the holding device is moved upward and downward. When a point of the eccentric cam which is the most distant from the rotatable axis member is moved up to a position right above, and down to a position right below, the axis member, the speed of movement of the elevating and lowering member takes zero and, when the cam is moved between the two positions, the speed is smoothly increased and smoothly decreased. In the case where the at least one main portion of the pivot-type holding device according to the twelfth feature (12) is provided as an integral portion of the at least one elevating and lowering member, the at least one pivotable portion of the holding device can be moved upward and downward.

(28) According to a twenty-eighth feature of the present invention which includes any one of the fourth to twenty-seventh features (4) to (27), at least one of the circuit-substrate carry-in device and the circuit-substrate supporting device comprises a positioning device which positions the circuit substrate in a third direction substantially parallel to the plane of the circuit substrate. This positioning device is not essentially needed but is advantageous if employed. The positioning device may be included in the CS carry-in device and/or the CS supporting device. The CS supporting device employs the positioning device more advantageously than the CS carry-in device. However, in the present CC mounting system, the CS is transferred from the CS carry-in device to the CS supporting device in the second direction. Accordingly, once the CS is positioned in the third direction by the CS carry-in device, the CS is automatically positioned in the third direction with respect to the CS supporting device. Thus, the CS supporting device does not essentially need the positioning device. In the case where the CS carry-in device comprises the third-direction carry-in device and the mounting device according to the fifth or sixth feature (5) or (6), it is desirable that the mounting device comprise the positioning device.

(29) According to a twenty-ninth feature of the present invention which includes any one of the fourth to twenty-eighth features (4) to (28), the circuit-substrate carry-in device comprises a plurality of carrying-direction positioning devices each of which positions the circuit substrate in a circuit-substrate carrying direction in which the circuit substrate is carried. In this case, the CS carry-in device can sequentially position a plurality of CSs which are carried in in the third direction, and can simultaneously transfer the thus positioned CSs to the CS supporting device. In this case, one or more upstream positioning devices which are provided on the upstream side of the most downstream positioning device in the CS carrying direction must be able to selectively take an operative state in which a positioning member thereof is moved to, and kept at, an operative position where the positioning member is engageable with each CS and an inoperative state in which the positioning member is moved to, and kept at, an inoperative position where the positioning member is not engageable with each CS. The most downstream positioning device may be one whose positioning member is not movable. The movable positioning member of the upstream positioning device or devices may be one which is movable upward and downward. In this case, the CS carry-in device can simultaneously carry in a plurality of CSs.

(30) According to a thirtieth feature of the present invention which includes any one of the fourth to twenty-ninth features (4) to (29), the circuit component mounting system further comprises a control device which controls the circuit-component mounting device, the circuit-substrate supporting device, and at least one of the circuit-substrate carry-in device and the circuit-substrate carry-out device. The control device may comprise a computer. Those devices may be controlled by a single control device, or by three or four control devices, respectively.

(31) According to a thirty-first feature of the present invention which includes the thirtieth feature (30), a the circuit-substrate carry-in device comprises a third-direction carry-in device which carries in the circuit substrate by moving the circuit substrate to a waiting position in a third direction substantially parallel to the plane of the circuit substrate; and a mounting device which holds the circuit substrate moved to the waiting position, waits while holding the circuit substrate, and mounts the circuit substrate on the circuit-substrate supporting device at the waiting position in the second direction, wherein the mounting device comprises a pivot-type holding device comprising at least one main portion, and at least one pivotable portion which is supported by the main portion such that the pivotable portion is pivotable to a holding position where the pivotable portion supports a lower surface of the circuit substrate and thereby holds the circuit substrate, and to a releasing position where the pivotable portion releases the circuit substrate, about an axis line substantially parallel to the plane of the circuit substrate, and wherein the control device includes waiting control means for keeping, at the waiting position, the pivotable portion at the holding position thereof. If the at least one pivotable portion is kept at its holding position with the mounting device being positioned at the waiting position, the pivotable portion can immediately receive, in the third direction, the CS which has been supplied in the third direction from the third-direction carry-in device. In the case where the at least one pivotable portion comprises the rotatable support members according to the thirteenth feature (13), the CS can be moved in the third direction when the rotatable support members are rotated. In the last case, it is desirable that the height position of the respective top ends of the rotatable support members be level with the height position where the CS is carried in by the third-direction carry-in device, so that the CS is smoothly transferred from the carry-in device onto the support members.

(32) According to a thirty-second feature of the present invention which includes the thirtieth or thirty-first feature (30) or (31), the circuit-substrate carry-out device comprises a removing device which removes, from the circuit-substrate supporting device, the circuit substrate with the circuit components being mounted thereon, at a circuit-substrate removing position, in the first direction, wherein the removing device comprises a pivot-type holding device comprising at least one main portion, and at least one pivotable portion which is supported by the main portion such that the pivotable portion is pivotable to a holding position where the pivotable portion supports a lower surface of the circuit substrate and thereby holds the circuit substrate, and to a releasing position where the pivotable portion releases the circuit substrate, about an axis line substantially parallel to the plane of the circuit substrate, and wherein the control device includes waiting control means for keeping, at the circuit-substrate removing position, the pivotable portion to the releasing position thereof. If the at least one pivotable portion is kept at its releasing position with the removing device being positioned at the CS removing position, the pivotable portion can immediately remove, in the first direction, the CS supported by the CS supporting device. For example, the removing device and/or the CS supporting device are/or moved toward each other in the second and/or first directions with the pivotable portion is kept at its releasing position, subsequently the pivotable portion is pivoted to its holding position, and then the removing device and/or the CS supporting device are/or moved away from each other. Consequently the CS is removed from the CS supporting device. In the case where the at least one pivotable portion comprises the rotatable support members according to the thirteenth feature (13), the removed CS can be carried out in the third direction by rotating the rotatable support members.

(33) According to a thirty-third feature of the present invention which includes any one of the fourth to thirty-second features (4) to (32), at least one of the circuit-substrate carry-out device and the circuit-substrate carry-in device comprises a holding device which holds the circuit substrate, and wherein the holding device comprises at least one main member; at least one pivotable member which is attached to the main member such that the pivotable member is pivotable about an axis line substantially parallel to the plane of the circuit substrate; a plurality of rotatable support members which are grouped into a first group and a second group and which are attached to the pivotable member such that the rotatable support members are arranged along a straight line parallel to the axis line of the pivotable member and each of the support members is rotatable about an axis line perpendicular to the axis line of the pivotable member; and a rotating device which selectively operates in a first mode in which the rotating device rotates the rotatable support members belonging to the first and second groups and in a second mode in which the rotating device rotates the rotatable support members belonging to the first group and does not rotate the rotatable support members belonging to the second group. When the rotatable support members belonging to the first group are rotated and the rotatable support members belonging to the second group are not rotated, a first CS supported on the first group of support members is moved in the third direction, and a second CS supported on the second group of support members is not moved. Thus, the present holding device can move a plurality of CSs one by one in the third direction. In the case where a plurality of CSs are sequentially moved, it is possible that one CS may ride on another CS. The present CC mounting system is free from this problem. In the case where all the rotatable support members are grouped into a plurality of groups each of which consists of an appropriate number of support members which can support just one CS, each group of support members can be so controlled as to be simultaneously rotated. Accordingly, the rotating device can be said as the grouped-support-members rotating device. In the case where the mounting device comprises the rotating device, it can be said as the plural-circuit-substrates simultaneously mounting device. In this case, when a first CS is supplied in the third direction from the third-direction carry-in device, all the groups of support members are rotated; and when a second CS is supplied, the group or groups of support members are rotated except the group of support members supporting the first CS. Thus, the second CS is moved while the first CS is not moved. When a third CS is supplied, the group or groups of support members are rotated except the groups of support members supporting the first and second CSs. All the rotatable support members may be grouped into three or more groups. Similarly, the removing device may comprise the present holding device and, in this case, the removing device can transfer a plurality of CSs one by one to the third-direction carry-out device in the third direction.

(34) According to a thirty-fourth feature of the present invention which includes any one of the fourth to thirty-third features (4) to (33), at least one of the circuit-substrate carry-out device, the circuit-substrate carry-in device, and the circuit-substrate supporting device comprises a holding device which holds the circuit substrate, and wherein the holding device comprises at least one holding member which holds the circuit substrate; and a switching device which switches the holding member to a holding position where the holding member holds the circuit substrate and to a releasing position where the holding member releases the circuit substrate. In a prior CC mounting system in which a CS is transferred in a direction parallel to the plane of the CS between a CS supporting device and a CS carry-in or carry-out device, each of the three devices may comprise, as a CS holding device thereof, a stationary belt conveyor which is provided by, e.g., a plurality of rollers, a belt wound on the rollers, and a drive device for rotating the rollers, and may not need a CS-holding-device switching device. On the other hand, in the present CC mounting system in which a CS is transferred in the first or second direction perpendicular to the plane of the CS, it is desirable that the holding device comprise the above-described switching device. The switching device may be one which moves the at least one holding member to its holding and releasing positions, or one which rotates the holding member to its holding and releasing positions. The holding device including the switching device can be said as the switchable-type holding device; and the holding device not including the switching device can be said as the un-switchable-type holding device.

The CS carry-in or carry-out device including the switchable-type holding device can be said as the switchable-type CS conveyor.

(35) According to a thirty-fifth feature of the present invention which includes any one of the fourth to thirty-fourth features (4) to (34), at least one of the circuit-substrate carry-out device and the circuit-substrate carry-in device comprises an unswitchable-type holding device which comprises a plurality of rollers, a belt which is wound on the rollers, and a rotating device which rotates the rollers; and a switchable-type holding device which is switchable to a holding state in which the switchable-type holding device holds the circuit substrate and to a releasing state in which the switchable-type holding device releases the circuit substrate. The unswitchable-type holding device transfers the CS in the third direction parallel to the plane of the CS, and the switchable-type holding device transfers the CS in the first or second perpendicular to the plane of the CS. For example, each of the third-direction carry-in and carry-out devices may comprise the unswitchable-type holding device, and each of the mounting and removing devices may comprise the switchable-type holding device. The third-direction carry-in and carry-out devices each of which comprises the unswitchable-type holding device can be said as the unswitchable CS conveyors; and the mounting and removing devices each of which comprises the switchable-type holding device can be called as the switchable CS conveyors.

(36) According to a thirty-sixth feature of the present invention, there is provided a method of mounting circuit components on a circuit substrate, comprising the steps of mounting the circuit components on the circuit substrate supported by a circuit-substrate supporting device, removing, from the circuit-substrate supporting device, the circuit substrate with the circuit components being mounted thereon, in a first direction substantially perpendicular to a plane of the circuit substrate, and carrying out the removed circuit substrate by moving the circuit substrate whose plane extends substantially horizontally, in a parallel direction substantially parallel to the plane of the circuit substrate. The step of mounting the CCs and the step of carrying out the removed CS may be concurrently performed. In the present CC mounting method, the CS on which the CCs have been mounted is removed in the first direction perpendicular to the plane of the CS. Thus, the time needed for performing the step of removing the CS can be reduced as compared with the case where the CS is removed in the parallel direction parallel to the plane of the CS.

(37) According to a thirty-seventh feature of the present invention which includes the thirty-sixth feature (36), the circuit component mounting method further comprises steps of carrying in the circuit substrate by moving the circuit substrate whose plane extends substantially horizontally, in the parallel direction to a circuit-substrate mounting position, and mounting, at the circuit-substrate mounting position, the circuit substrate on the circuit-substrate supporting device in a second direction opposite to the first direction, wherein the step of removing the circuit substrate comprises removing the circuit substrate at a circuit-substrate removing position away from the circuit-substrate mounting position in the parallel direction. The step of mounting the CCs and the step of carrying in the CS may be concurrently performed. In the present CC mounting method, the CS moved to the CS mounting position is mounted on the CS supporting device in the second direction perpendicular to the plane of the CS. Thus, the time needed for performing the step of mounting the CS can be additionally reduced. In short, the present CC mounting method enjoys the same advantages as those of the CC mounting system wherein the CS carry-in and carry-out devices comprise the mounting device and the removing device, respectively, and the CS supporting device comprises the main holding device and the main-holding-device moving device.

(38) According to a thirty-eighth feature of the present invention which includes the thirty-sixth or thirty-seventh feature (36) or (37), the circuit component mounting method further comprises, after the step of mounting the circuit components and before the step of removing the circuit substrate, a step of moving the circuit substrate with the circuit components being mounted thereon, from a circuit-component mounting position where the circuit components are mounted on the circuit substrate to a circuit-substrate removing position where the circuit substrate is removed. In this case, the CS on which the CCs have been mounted is moved to the CS removing position where the CS is removed.

(39) According to a thirty-ninth feature of the present invention which includes the thirty-seventh or thirty-eighth feature (37) or (38), the step of carrying in the circuit substrate comprises carrying in the circuit substrate to a waiting position, and waiting while holding, at the waiting position, the circuit substrate carried in to the waiting position. Since the CS waits at the waiting position, the CS can be immediately mounted on the CS supporting device when the CS supporting device is permitted to receive the CS. The waiting position and the CS mounting position may, or may not, be the same position. Since the CS mounting position and the CS removing position are distant from each other, the step of carrying in the CS and/or the step of waiting may be performed concurrently with the step of removing the CS. The waiting step can be said as the CS-mounting preparation step.

(40) According to a fortieth feature of the present invention which includes any one of the thirty-sixth to thirty-ninth features (36) to (39), the circuit component mounting method further comprises, after the step of mounting the circuit substrate and before the step of mounting the circuit components, a step of moving the circuit substrate which has been mounted on the circuit-substrate supporting device and on which no circuit component has been mounted, from the circuit-substrate mounting position to a circuit-component mounting position where the circuit components are mounted on the circuit substrate. After the CS is mounted at the CS mounting position, the CS is moved to the CC mounting position where the CCs are mounted on the CS.

(41) According to a forty-first feature of the present invention which includes any one of the thirty-sixth to fortieth features (36) to (40), the step of carrying out the circuit substrate comprises carrying out a plurality of circuit substrates one by one in the parallel direction, and wherein the step of removing the circuit substrate comprises simultaneously removing the plurality of circuit substrates from the circuit-substrate supporting device. Similarly, the step of carrying in the circuit substrate may comprise carrying in a plurality of circuit substrates one by one in the parallel direction, and the step of mounting the circuit substrate may comprise simultaneously mounting the plurality of circuit substrates on the circuit-substrate supporting device.

(42) According to a forty-second feature of the present invention which includes any one of the thirty-sixth to forty-first features (36) to (41), the circuit component mounting method further comprises a step of mounting, at a time different from a time when the circuit substrate as a first circuit substrate is removed from the circuit-substrate supporting device in the first direction, a second circuit substrate on the circuit-substrate supporting device in a second direction opposite to the first direction. In a prior CC mounting method, a CS-removing step and a CS-mounting step are concurrently performed. On the other hand, in the present CC mounting method, the CS-removing step and the CS-mounting step are performed at different times. In the prior CC mounting method, the removing and mounting of the CS is done in the parallel direction, whereas in the present CC mounting method, the removing and mounting of the CS is done in the first and second directions. Therefore, the present CC mounting method can reduce the overall time needed for removing and mounting the CS, although the CS-removing step and the CS-mounting step are performed at different times.

(43) According to a forty-third feature of the present invention which includes any one of the thirty-sixth to forty-second features (36) to (42), the step of carrying out the removed circuit substrate comprises a step of moving the removed circuit substrate upward from a circuit-substrate removing height position where the circuit substrate is removed from the circuit-substrate supporting device, to a parallel-direction-movement height position where the removed circuit substrate is moved in the parallel direction. Similarly, the step of carrying in the circuit substrate may comprise a step of moving the circuit substrate downward from a parallel-direction-movement height position where the circuit substrate is moved in the parallel direction, to a circuit-substrate mounting height position where the circuit substrate is mounted on the circuit-substrate supporting device.

(44) According to a forty-fourth feature of the present invention which includes the forty-third feature (43), the step of moving the removed circuit substrate upward comprises moving a holding device holding the removed circuit substrate, upward, at a speed lower than a speed at which the holding device from which the removed circuit substrate has been carried out in the parallel direction is moved downward from the parallel-direction-movement height position to the circuit-substrate removing height position. Since the removed CS has the CCs mounted thereon, it is desirable that the removed CS be moved upward at a low speed. Since the CS supporting device including the holding device is not involved in the CS carry-out step as described above, the overall time needed for removing and mounting the CS is not increased even if the CS is elevated slowly. Similarly, the step of moving the circuit substrate downward may comprise moving a holding device holding the circuit substrate, downward, at a speed lower than a speed at which the holding device not holding a circuit substrate is moved upward from the circuit-substrate mounting height position to the parallel-direction-movement height position. The holding device not holding a CS can be moved upward at a high speed.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Figure 1:
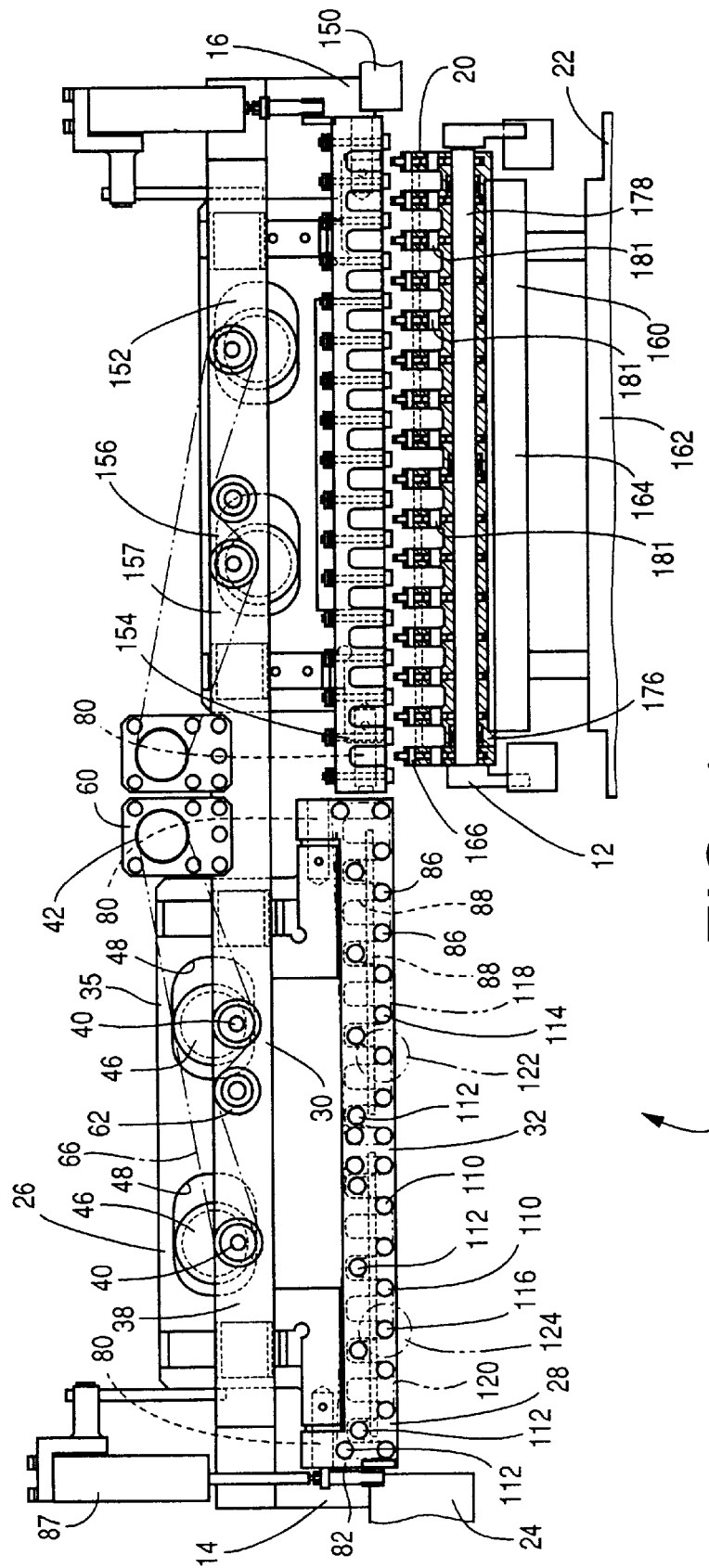
FIG. 1 is a front elevation view of a circuit component ("CC") mounting system to which the present invention is applied.

Referring to the drawings, there will be described a circuit component ("CC") mounting system 8 embodying the present invention. The CC mounting system 8 implements a CC mounting method also embodying the present invention.

Figure 2:
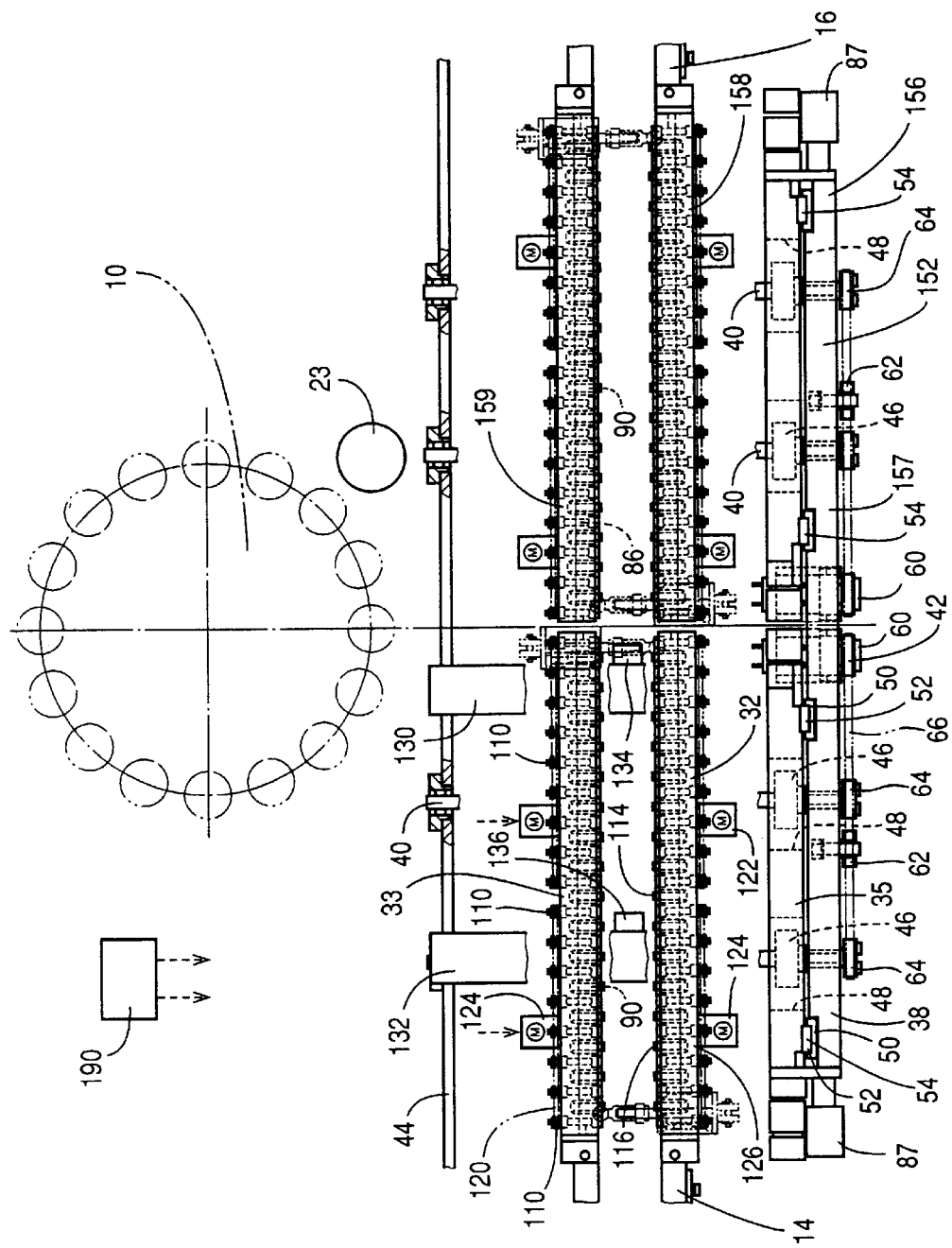
FIG. 2 is a plan view of the CC mounting system of FIG. 1.
Figure 3:
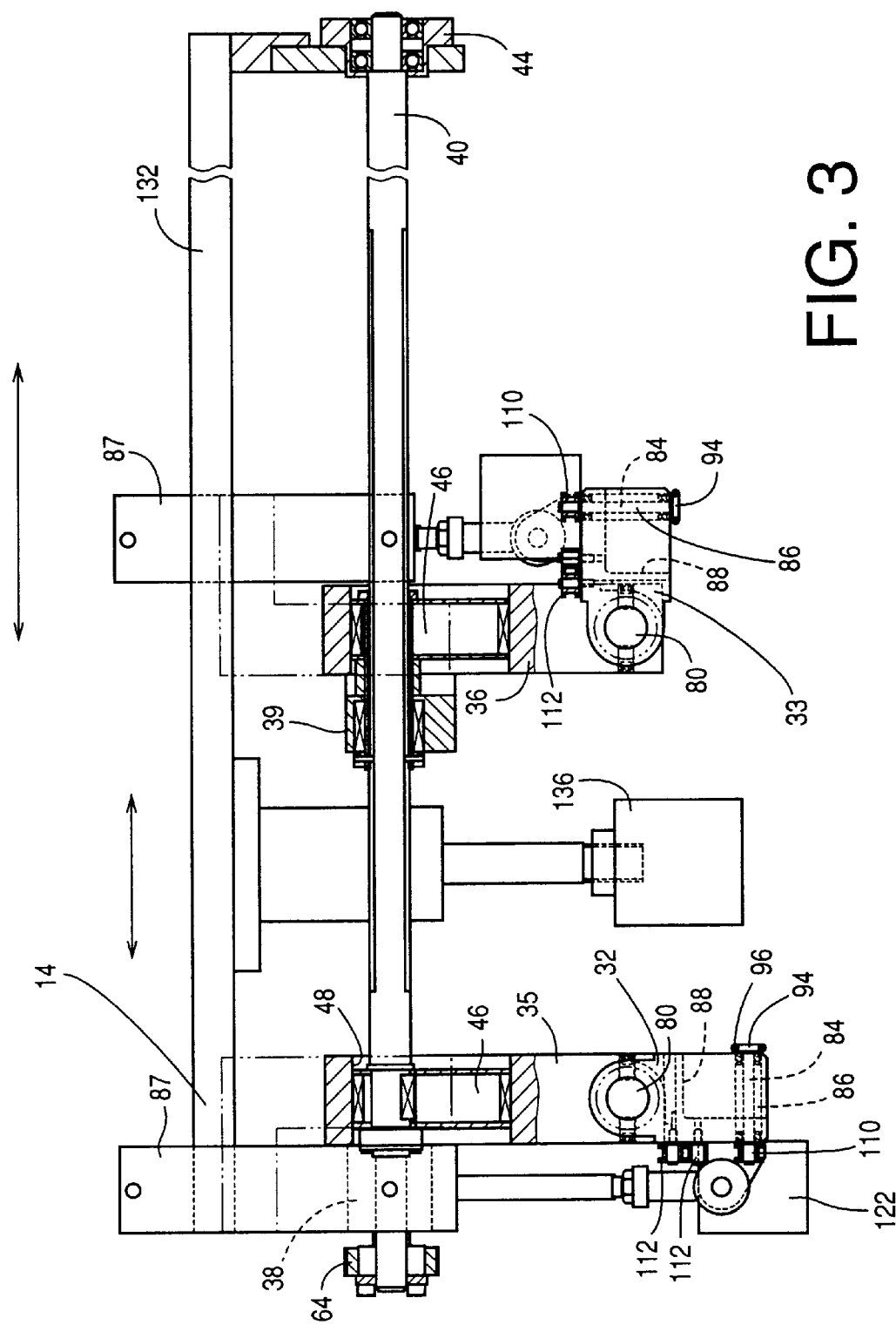
FIG. 3 is a partly cross-sectioned, side elevation view of a circuit substrate ("CS") carry-in device of the CC mounting system of FIG. 1.

As shown in FIGS. 1, 2, and 3, the CC mounting system 8 includes a CC mounting device 10 (FIG. 2) which mounts, at a CC mounting position, CCs on a circuit substrate ("CS"); a CS supporting device 12 which supports the CS at at least the CC mounting position; a CS carry-in device 14 which carries in the CS and transfers the CS to the CS supporting device 12; and a CS carry-out device 16 which receives, from the CS supporting device 12, the CS on which the CCs have been mounted, and carries out the CS. The CS carry-in and carry-out devices 14, 16 are provided adjacent to each other on a CS carrying route on which the CS is carried, and the CC mounting device 10 is provided at the CC mounting position offset from the CS carrying route. The CC supporting device 12 includes a main CS-holding device 20 which holds the CS, and a main-holding-device moving device 22 which moves, in a horizontal plane, the main CS-holding device 20 to the CC mounting position, a CS mounting position where the CS is mounted on the CS supporting device 12 by the CS carry-in device 14, and a CS removing position where the CS is removed from the CS supporting device 12 by the CS carry-out device 16.

The CS carried in by the CS carry-in device 14 is mounted on the CS supporting device 12 at the CS mounting position, and the mounted CS is moved to the CC mounting position in an X direction and a Y direction normal to the X direction in the horizontal plane. At the CC mounting position, a camera 23 reads fiducial marks provided on the CS and subsequently the CC mounting device 10 mounts CCs on the CS. The CS on which the CCs have been mounted is moved to the CS removing position where the CS is removed by the CS carry-out device 16, which then carries out the CS.

The CS carry-in device 14 includes a CS horizontal-carry-in ("HCI") device 24 and a CS mounting device 26. The CS HCI device 24 carries in a CS supplied from a CS supplying device (not shown), in a horizontal direction, and transfers the CS to the CS mounting device 26 in the horizontal direction. The CS HCI device 24 includes a conveyor device (not shown) including a pair of conveyor belts and a drive device for moving the conveyor belts and thereby moving the CS in the horizontal direction.

The CS mounting device 26 receives, in the horizontal direction, the CS moved to the CS mounting position, holds the CS, and mounts the CS on the CS supporting device 12 in a vertically downward direction substantially perpendicular to the plane of the CS. The CS mounting device 26 includes a CS holding device 28, and an elevating and lowering device 30 which elevates and lowers the CS holding device 28 in a Z direction perpendicular to the X and Y directions. The CS holding device 28 includes a pair of pivotable holding portions 32, 33 which are opposed to each other and which are pivotally supported by a pair of elevating and lowering members 35, 36 of the elevating and lowering device 30, respectively.

The elevating and lowering device 30 includes, in addition to the elevating and lowering members 35, 36, two main members 38, 39 which support the two elevating and lowering members 35, 36, respectively, such that the elevating and lowering members 35, 36 are vertically movable; two drive shafts 40; and a drive device 42. The two drive shafts 40 extends through the two elevating and lowering members 35, 36, the two main members 38, 39, and a frame 44 extending in a CS carrying direction, such that the two drive shafts 40 are rotatable relative to the members 35, 36, 38, 39. The first main member 38 and the first elevating and lowering member 35 are attached to the drive shafts 40, such that the two first members 38, 35 are not movable relative to the shafts 40 in an axial direction of the shafts 40; and the second main member 39 and the second elevating and lowering member 36 are attached to the drive shafts 40, such that the two second members 39, 36 are movable relative to the shafts 40 in the axial direction of the shafts 40 and are fixable at a predetermined position to the shafts 40. Thus, the second main member 39 and the second elevating and lowering member 36 are movable toward, and away from, the first main member 38 and the first elevating and lowering member 35. When the second members 39, 36 are moved toward the first members 38, 35, the second pivotable holding portion 33 is moved toward the first pivotable holding portion 32, so that the CS holding device 28 can hold a CS of a sort having a small width; and, when the second members 39, 36 are moved away from the first members 38, 35, the second pivotable holding portion 33 is moved away from the first pivotable holding portion 32, so that the CS holding device 28 can hold a CS of a sort having a great width. Thus, the elevating and lowering device 30 has the function of adjusting the distance between the two pivotable holding portions 32, 33, owing to the movement of the second pivotable holding portion 33 relative to the first pivotable holding portion 32. Thus, the CS mounting device 26 can mount various sorts of CSs having different widths, on the CS supporting device 12. The main members 38, 39 and the frame 44 provide main portions of the CS holding device 28.

Two eccentric cams 46 are fixed to each of the two drive shafts 40, such that the eccentric cams 46 are not rotatable relative to the each drive shaft 40. Each of the two elevating and lowering members 35, 36 has two elliptic holes 48 each of which is elongate in a horizontal direction. Each of the four eccentric cams 46 is engaged with a corresponding one of the four elliptic holes 48 via a needle bearing, such that the each eccentric cam 46 is not movable relative to the corresponding elliptic hole 48 in the Z direction. Each of the two main members 38, 39 has two guide grooves 50 which extend in the Z direction and each of which has a generally U-shaped cross section (however, only the grooves 50 of the main member 38 are shown in FIG. 2). Each of the two elevating and lowering members 35, 36 has two guide projections 52 which are engaged with the two guide grooves 50 of a corresponding one of the two main members 38, 39 (however, only the projections 52 of the elevating and lowering member 35 are shown in FIG. 2). Owing to the guide grooves 50 and the guide projections 52, the elevating and lowering members 35, 36 are moved in the Z direction while being prevented from being moved in the X or Y direction. Thus, each of the four guide grooves 50 and a corresponding one of the four guide projections 52 cooperate with each other to provide a guide device 54.

Figure 4:
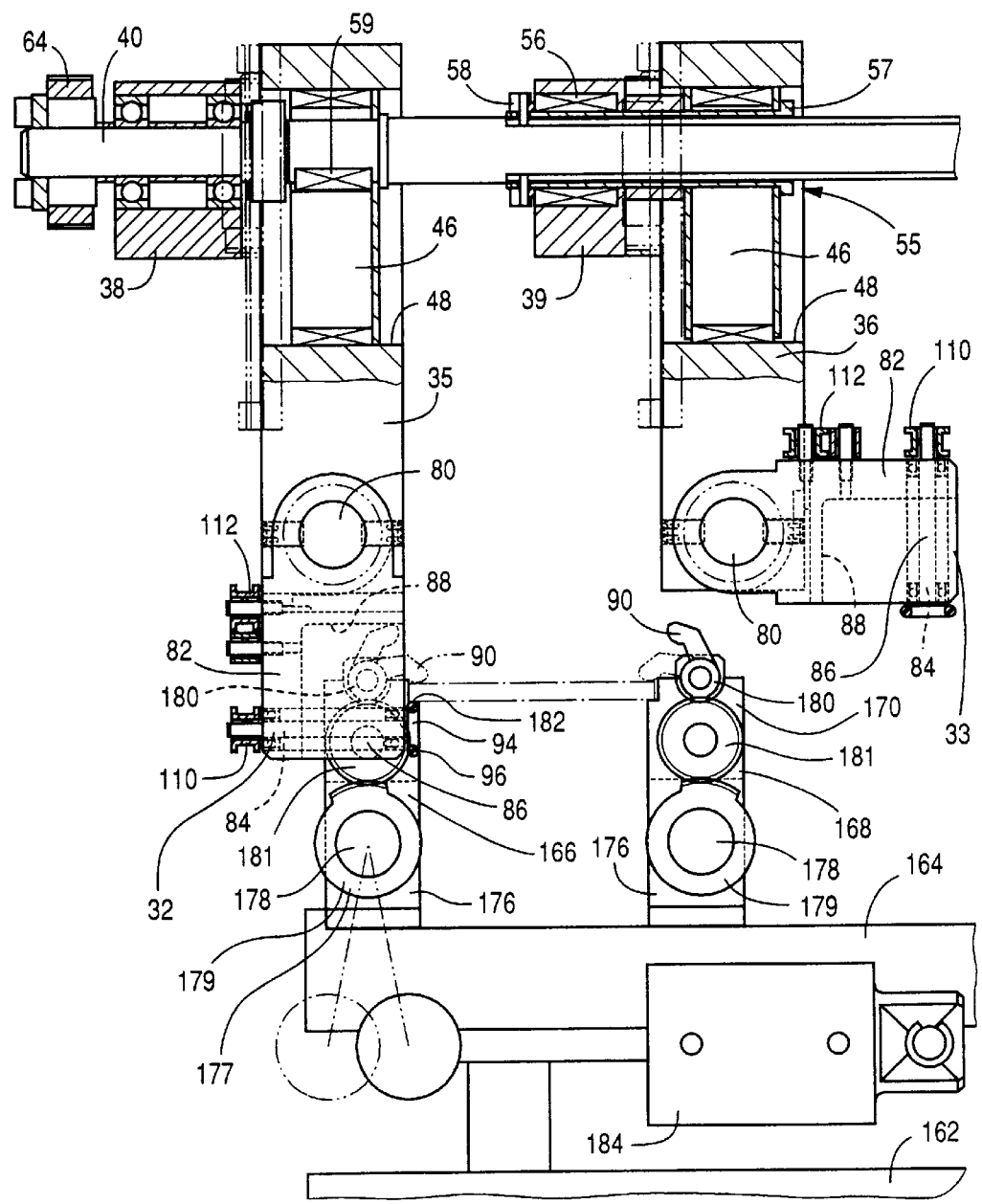
FIG. 4 is an enlarged view of a CS transferring device of the CC mounting system of FIG. 1.

As shown in FIG. 4, each of the drive shafts 40 has a spline groove in which a spacer 55 fits such that the spacer 55 is not rotatable relative to the each drive shaft 40 and is movable in the axial direction thereof relative thereto. The main member 39 is attached to the spacer 55 via a bearing 56 such that the main member 39 is rotatable relative to the spacer 55, and the eccentric cam 46 associated with the elevating and lowering member 36 is attached to the spacer 55 via a key (not shown) such that the cam 46 is not rotatable relative to the spacer 55. The spacer 55 has a flange 57 at one of axially opposite end portions thereof, and has a plurality of radial holes formed in an outer circumferential surface of the other axial end portion thereof. A spline pin 58 fits in each of the radial holes. Thus, the main member 39 and the eccentric cam 46 are sandwiched by the spline pins 58 and the flange 57 in the axial direction of the spacer 55, and is fixed relative to the spacer 55 in the axial direction thereof. A spacer which is provided between the main member 39 and the eccentric cam 46, cooperates with the flange 57 to position the cam 46 in the axial direction of the drive shaft 40. Thus, the main member 39, the elevating and lowering member 36, and the spacer 55 are moved as a unit in the axial direction of the drive shaft 40. When the drive shaft 40 is rotated, the spacer 55 is rotated with the shaft 40, and the rotation of the spacer 55 is transmitted to the eccentric cam 46 via the key. However, the rotation of the spacer 55 is not transmitted to the main member 39.

The main member 38 and the elevating and lowering member 35 are attached to the drive shaft 40 such that those members 38, 35 are not movable relative to the drive shaft 40 in the axial direction thereof. The main member 38 is attached to the drive shaft 40 via a bearing such that the main member 38 is rotatable relative to the drive shaft 40, and the eccentric cam 46 is attached to the drive shaft 40 via a key 59 such that the cam 46 is not rotatable relative to the shaft 40.

The drive device 42 includes an electric motor 60, a guide pulley 62, the two drive shafts 40, two timing pulleys 64 associated with the two drive shafts 40, respectively, and a belt 66 wound on the guide pulley 62 and the timing pulleys 64. The rotation of the electric motor 60 is transmitted to the drive shafts 40 via the belt 66 and, the rotation of the drive shafts 40 causes the rotation of the eccentric cams 46. Thus, the elevating and lowering members 35, 36 are elevated and lowered while being guided by the guide devices 54. Each time the eccentric cams 46 are rotated by 180 degrees, the elevating and lowering members 35, 36 are elevated from their lowermost position to their uppermost position, or are lowered from their uppermost position to their lowermost position.

As the speed of rotation of the drive shafts 40 increases, the speed of upward and downward movement of the elevating and lowering members 35, 36 increases. However, since the upward and downward movement of the elevating and lowering members 35, 36 is caused by the rotation of the eccentric cams 46, the speed of upward and downward movement of the members 35, 36 becomes substantially zero in the vicinity of their uppermost and lowermost positions, even if the speed of rotation of the drive shafts 40 may be constant. Thus, the speed of upward and downward movement of the members 35, 36 smoothly changes between their uppermost and lowermost positions. Thus, the upward and downward movement of the CS can be started and ended at a low acceleration and/or a low deceleration, which contributes to reducing the impact exerted to the CS and thereby preventing the CCs from being moved out of position on the CS. In addition, the elevating and lowering members 35, 36 can be moved to their uppermost and lowermost positions with high accuracy. Moreover, this arrangement contributes to reducing the vibration and/or noise produced by the CS mounting device 26.

The two pivotable holding portions 32, 33 are pivotally attached to the two elevating and lowering members 35, 36, respectively. When the members 35, 36 are elevated and lowered, the holding portions 32, 33 are elevated and lowered between a CS-receiving height position where the holding portions 32, 33 receive, from the CS HCI device 24, the CS in the horizontal direction parallel to the plane of the CS, and a CS-mounting height position where the holding portions 32, 33 mount the CS on the CS supporting device 12. Thus, the elevating and lowering members 35, 36 also function as main portions of the CS holding device 28.

Next, there will be described the construction of the pivotable holding portion 32 as a representative of the two pivotable holding portions 32, 33 that have an identical construction. As shown in FIG. 4, the holding portion 32 includes a pivotable member 82, and a plurality of rotatable support members 86. The pivotable member 82 is pivotally attached to a horizontal axis member 80 which extends in the CS carrying direction along the elevating and lowering member 35. The rotatable support members 86 are attached to the pivotable member 82 such that the support members 86 are rotatable relative to the pivotable member 82 about respective axis members 84 perpendicular to the axis member 80. The pivotable member 82 is pivoted between its CS holding position where the rotatable support members 82 take their horizontal attitudes, and its CS releasing position where the support members 82 take their vertical attitudes. Thus, the pivotable holding portion 32 can be switched between its CS holding state and its CS releasing state.

The CS is supported by the two pivotable holding portions 32, 33 such that width-wise opposite end portions of the CS are supported on the rotatable support members 86 of the two holding portions 32, 33, respectively. The respective pivotable members 82 of the holding portions 32, 33 are pivoted about the respective axis members 80 by respective air-operated cylinder devices 87.

The pivotable member 82 of the pivotable holding portion 32 supports the plurality of rotatable support members 86 such that the support members 86 are equidistant from one another at an appropriate regular interval of distance along a horizontal straight line. A recess 88 is formed between each pair of adjacent rotatable support members 86. Thus, the support members 86 and the recesses 88 are alternately provided. In a state in which the pivotable member 82 takes its CS holding position, each recess 88 opens in a bottom surface of the pivotable member 82 and an inner surface of the same 82 which is opposed to that of the pivotable member 82 of the other pivotable holding portion 33. Thus, each recess 88 can accommodate a clamp member 90 of the main CS-holding device 20 of the CS supporting device 12, as will be described later.

A support roller 94 is attached to one axial end portion of each of the rotatable support members 86 which portion is to contact or engage the CS. A friction ring 96 covers an outer circumferential surface of the support roller 94. Owing to the friction rings 96, a great friction force is produced between the support members 86 and the CS. Thus, the rotations of the support members 86 can be transmitted to the CS with reliability.

A driven pulley 110 is attached to the other axial end portion of each of the rotatable support members 86 which portion is remote from the support roller 94. A plurality of guide pulleys 112 are rotatably attached to the pivotable member 82 such that the driven pulleys 110 and the guide pulleys 112 are positioned in the same plane. As shown in FIGS. 1 and 2, the driven pulleys 110 and the guide pulleys 112 are grouped into an upstream-side group 114 and a downstream-side group 116 in the CS carrying direction, and a belt 118 is wound on the driven pulleys 110 and the guide pulleys 112 of the upstream-side group 114 and a belt 120 is wound on the pulleys 110, 112 of the downstream-side group 116. The belt 118 is driven by a drive motor 122, and the belt 120 is driven by a drive motor 124. The respective rotations of the two drive motors 122, 124 are synchronized with each other.

In the present embodiment, each of the driven pulleys 110 is a flanged pulley, and some of the guide pulleys 112 are flanged pulleys and the other guide pulleys 112 are non-flanged pulleys. Thus, the belts 118, 120 are easily wound on the pulleys 110, 112 and simultaneously are effectively prevented from coming off the pulleys 110, 112. The driven pulleys 110, the guide pulleys 112, the belts 118, 120, and the drive motors 122, 124 cooperate with one another to provide a rotating device 126 which rotates the rotatable support members 86. When the support members 86 are rotated, the CS supported on the members 86 are moved in the horizontal direction parallel to the plane of the CS. Accordingly, the rotating device 126 and the support members 86 cooperate with each other to provide a CS moving device which moves the CS in a parallel direction parallel to the plane of the CS.

Two frames 130, 132 bridge between the frame 44 and the main member 38 of the elevating and lowering device 30, over the main member 39 and the elevating and lowering members 35, 36. Two positioning devices 134, 136 are attached to the two frames 130, 132, respectively, such that the positioning devices 134, 136 are movable along guide members in a direction perpendicular to the CS carrying direction, i.e., the width-wise direction of the CS. The positioning devices 134, 136 function as CS-carrying-direction CS-positioning devices each of which stops the CS when the CS is carried in the CS carrying direction. The downstream-side positioning device 134 is not vertically movable but the upstream-side positioning device 136 is vertically movable. The positioning device 136 normally takes its upper, inoperative position and, when the second CS is carried in after the first CS, is lowered to its lower, operative position, as will be described later.

Since the positioning devices 134, 136 are movable in the width-wise direction of CSs, those devices 134, 136 can act on a generally middle portion of each of different sorts of CSs having different widths.

The CS carry-out device 16 includes a CS horizontal-carry-out ("HCO") device 150, and a CS removing device 152. The CS HCO device 150 carries out the CS in a horizontal direction parallel to the plane of the CS. The CS removing device 152 removes the CS on which the CCs have been mounted, in the direction of thickness of the CS, i.e., a vertically upward direction perpendicular to the plane of the CS, and transfers the CS to the CS HCO device 150. The CS removing device 152 includes a CS holding device 154 which removes the CS from the CS supporting device 12 and holds the CS, and an elevating and lowering device 156 which elevates and lowers the CS holding device 154 between a CS-removing height position where the CS holding device 154 removes the CS supported on the CS supporting device 12, and a CS-transferring height position where the CS holding device 154 transfers the removed CS to the CS HCO device 150 in the horizontal direction.

The CS HCO device 150 and the CS removing device 152 have respective constructions similar to those of the CS HCI device 24 and the CS mounting device 26, respectively, and the description of the former devices is omitted. It is however noted that a fixed one 157 of two main members of the elevating and lowering device 156 is integral with the fixed main member 38 of the elevating and lowering device 30, and that the CS-carry-out CS holding device 154 includes a pair of pivotable holding portions 158, 159 like the CS-carry-in CS holding device 28.

The CS supporting device 12 includes, in addition to the previously described main CS-holding device 20 and the main-holding-device moving device 22, an elevating and lowering device 160 which elevates and lowers the main CS-holding device 20 in the Z direction. The moving device 22 includes an X-Y table 162 for moving the main CS-holding device 20 in the X and Y directions in the horizontal plane. The elevating and lowering device 160 includes a Z-direction slider 164, and a device which elevates and lowers the Z-direction slider 164. In the present embodiment, the main CS-holding device 20 is provided on the Z-direction slider 164, and the Z-direction slider 164 is provided on the X-Y table 162. Thus, the CS held by the main CS-holding device 20 can be moved in both the horizontal direction and the vertical direction. The main CS-holding device 20 is vertically movable between a CS-mounting height position where the CS mounting device 26 mounts the CS on the main CS-holding device 20, a CS-removing height position where the CS removing device 152 removes the CS from the main CS-holding device 20, a CC-mounting height position where the CCs are mounted on the CS, and a horizontal-movement height position where the main CS-holding device 20 is moved in the horizontal plane. In the present embodiment, the CS-mounting height position is level with the CS-removing height position.

As shown in FIG. 4, the main CS-holding device 20 includes a pair of CS clamping devices 166, 168 which clamp the CS at the width-wise opposite end portions thereof, respectively. The CS clamping device 166 is fixedly provided, and the CS clamping device 168 is provided such that the device 168 is movable relative to the fixed device 166 in the width-wise direction of the CS. There will be described the construction of the CS clamping device 166 as a representative of the two CS clamping devices 166, 168 which have an identical construction. It is noted that the main CS-holding device 20 cooperates with the CS-carry-in CS holding device 28 to provide a first CS transferring device 170, and cooperates with the CS-carry-out CS holding device 154 to provide a second CS transferring device 170.

The CS clamping device 166 includes the previously described clamp members 90, a comb-like main member 176, and a clamp-member pivoting device 177 which pivots the clamp members 90 to a CS clamping position where the clamp members 90 clamp the CS and a CS releasing position where the clamp members 90 release the CS. The clamp-member pivoting device 177 includes a single rotatable axis member 178 which is provided on the main member 176 such that the axis member 178 is rotatable relative to the main member 176; a plurality of drive gears 179 which are provided on the axis member 178 such that the drive gears 179 are not rotatable relative to the axis member 178; a plurality of sector gears 180 which are provided as respective integral portions of the clamp members 90; and a plurality of intermediate gears 181 which are provided between the drive gears 179 and the corresponding sector gears 180. The drive gears 179, the sector gears 180, and the intermediate gears 181 cooperate with one another to provide a rotation transmitting device which transmits the rotation of the axis member 178 to the clamp members 90.

The clamp members 90 are provided on respective upper surfaces of teeth of the comb-like main member 176. The teeth of the main member 176 have respective inner recesses 182. The clamp members 90 cooperate with the inner recesses 182 to clamp the CS. The intermediate gears 181 are meshed with the drive gears 179, respectively, and are meshed with the sector gears 180, respectively. Therefore, the rotation of the axis member 178 is transmitted to the clamp members 90 via the gears 179, 181, and 180, so that the clamp members 90 are pivoted to their CS clamping and CS releasing positions. The axis member 178 is rotated by an air-operated cylinder device 184.

The present CC mounting system 8 includes a control device 190 (FIG. 2) which is essentially provided by a computer and which controls the electric motors 60, 122, 124, etc.

Next, there will be described the operation of the CC mounting system 8 constructed as described above, by reference to FIGS. 8 and 9.

Figure 8:
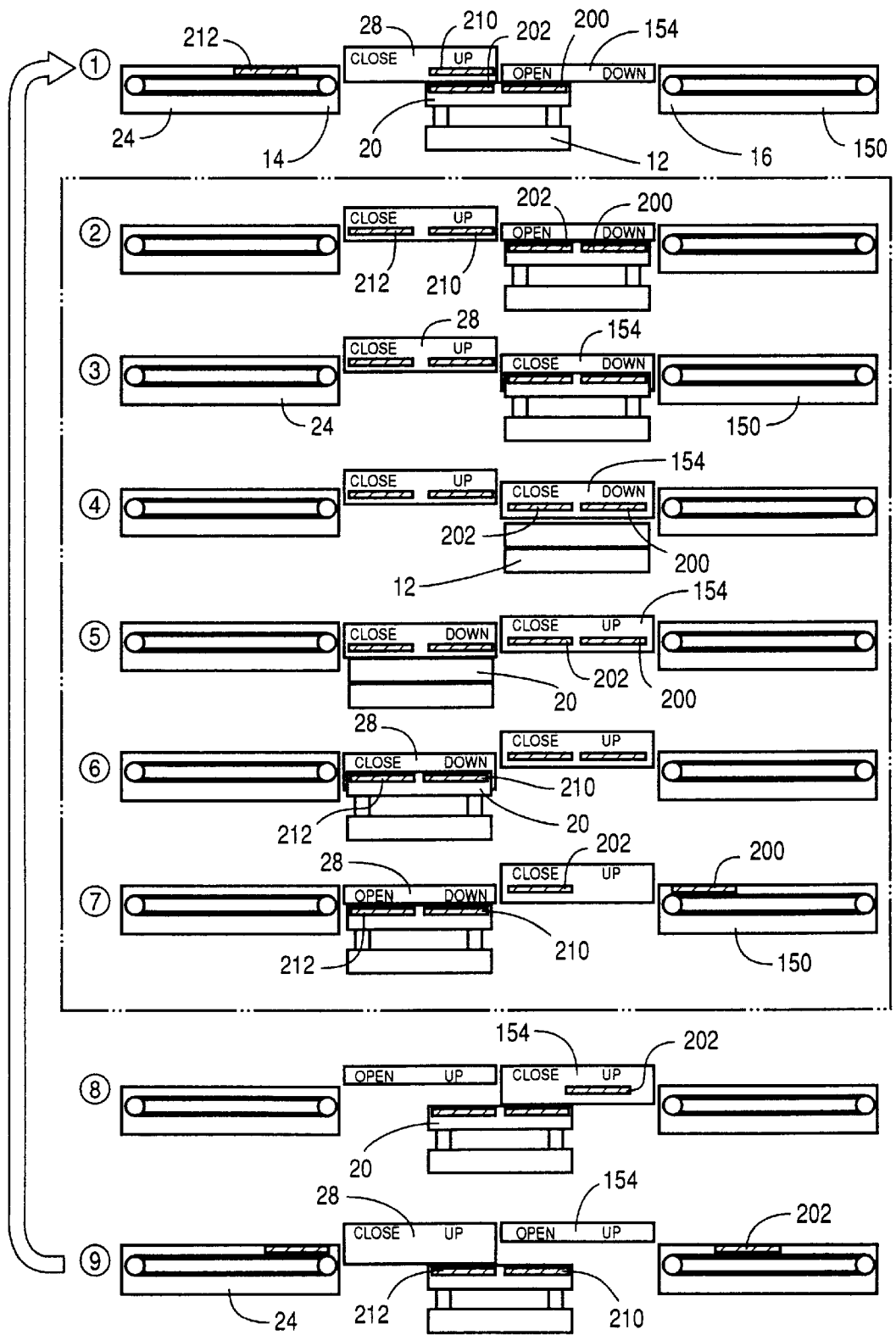
FIG. 8 is a view showing various steps of a CS transferring operation of the CC mounting system of FIG. 1.

The first and second steps illustrated in FIG. 8 are CS carry-in steps. After the CC mounting device 10 finishes mounting CCs on CSs 200, 202, the main CS-holding device 20 which holds the CSs 200, 202 on which the CCs have been mounted is moved, by the main-holding-device moving device 22, from the CC mounting position to the CS removing position in a horizontal direction parallel to the plane of each CS 200, 202. The term "OPEN" used in FIG. 8 indicates that the pair of pivotable members 82 of the CS-carry-in or CS-carry-out CS holding device 28 or 154 take their CS releasing position; the term "CLOSE" indicates that the pair of pivotable members 82 take their CS holding position; the term "UP" indicates that the CS-carry-in or CS-carry-out CS holding device 28 or 154 take their CS receiving or CS transferring height position; and the term "DOWN" indicates that the CS-carry-in or CS-carry-out CS holding device 28 or 154 take their CS mounting or CS removing height position.

Now, the CS-carry-out CS holding device 154 is, at its CS removing position, in a waiting state in which the CS holding device 154 is ready for removing the CSs 200, 202 clamped by the main CS-holding device 20. That is, the CS holding device 154 is at its CS removing height position, and the pivotable members 82 of the CS holding device 154 are at their CS releasing position.

In addition, new CSs 210, 212 are carried in by the CS HCI device 24 in the horizontal direction parallel to the respective planes of the CSs 210, 212, and are transferred to the CS mounting device 26. Both of the drive motors 122, 124 of the CS-carry-in CS holding device 28 are operated, and all the rotatable support members 86 belonging to both the downstream-side and upstream-side groups 114, 116 are rotated. The first CS 210 is moved with the rotation of the support members 86 in the horizontal direction parallel to the plane of the CS 210, until the leading end of the CS 210 butts the downstream-side positioning device 134. In this state, the upstream-side positioning device 136 is at its upper position where the positioning device 136 cannot stop the CS 210. When the CS 210 butts the positioning device 134, the drive motor 122 is stopped and accordingly the CS 210 is stopped there.

Subsequently, the upstream-side positioning device 136 is lowered to its CS positioning height position. Only the drive motor 124 is operated and only the rotatable support members 86 belonging to the upstream-side group 116 are rotated. Since the rotatable support members 86 belonging to the downstream-side group 114 are not rotated, the first CS 210 is prevented from being moved in any direction and accordingly it remains stopped. When the second CS 212 is moved in the horizontal direction parallel to the plane of the CS 212 and the leading end of the CS 212 butts the upstream-side positioning device 136, the drive motor 124 is stopped and the CS 212 is stopped there. Thus, the CS holding device 28 holds the two CSs 210, 212 which have thus been positioned in the CS carrying direction, and waits in this state.

Figure 5:
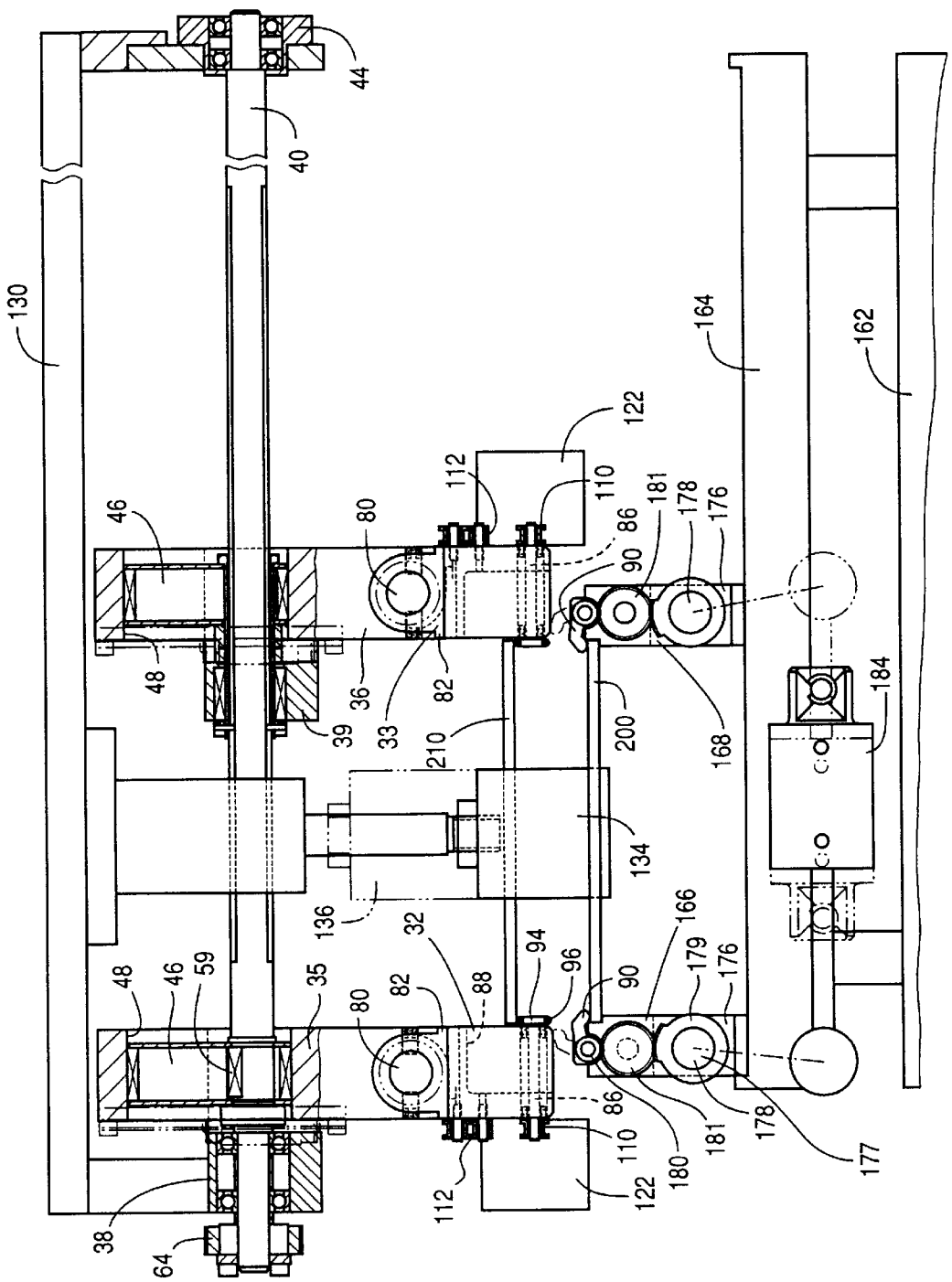
FIG. 5 is a view showing an operation state of the CC mounting system of FIG. 1.

In this way, while CCs are mounted on CSs at the CC mounting position and the CSs on which the CCs have been mounted are moved from the CC mounting position to the CS removing position, new CSs are carried in by the CS HCI device 24 and are transferred to the CS mounting device 26 in the horizontal direction parallel to the planes of the new CSs. Then, the CS holding device 28 waits in this state, as shown in FIG. 5.

Figure 6:
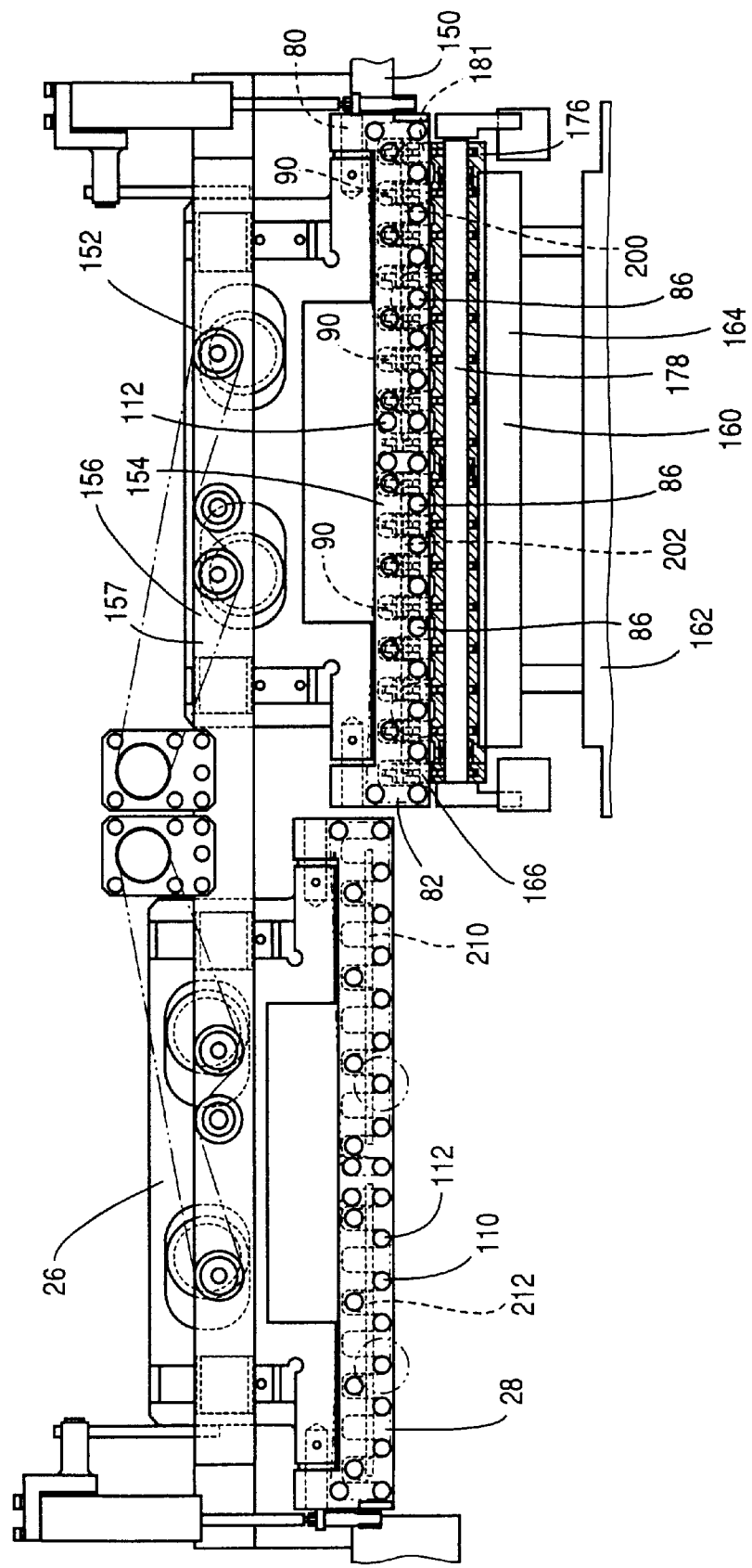
FIG. 6 is a view showing another operation state of the CC mounting system of FIG. 1.

When the main CS-holding device 20 arrives at the CS removing position, the third step shown in FIG. 8, that is, the CS removing step starts. In the CS removing device 152, the pivotable members 82 of the CS-carry-out CS holding device 154 are rotated to their CS holding position and, in the CS supporting device 12, the clamp members 90 are rotated to their CS releasing position. Thus, the two CSs 200, 202 are held by the CS holding device 154 and are simultaneously removed from the CS supporting device 12 in the direction of thickness of each CS 200, 202 perpendicular to the plane of the same 200, 202. While the pivotable members 82 are at their CS holding position, the clamp members 90 are accommodated in the recesses 88, respectively, as shown in FIG. 6. Thus, the clamp members 90 and the rotatable support members 86 are alternate with each other, that is, the CS clamping positions and the CS holding positions are alternate with each other on the CS. Accordingly, the support members 86 and the clamp members 90 do not interfere with each other. Therefore, the clamp members 90 of the main CS-holding device 20 can be rotated between their CS clamping position and their CS releasing position, while simultaneously the pivotable members 82 of the CS-carry-out CS holding device 154 are rotated between their CS releasing position and their CS holding position. Thus, the CS transferring operation can be performed smoothly.

It emerges from the foregoing description that in the present embodiment, when the CSs 200, 202 on which the CCs have been mounted are transferred between the CS supporting device 12 and the CS carry-out device 16, the CSs 200, 202 are not substantially moved, which leads to reducing the impact exerted to the CSs 200, 202 and effectively preventing the CCs from being moved out of position on the CSs 200, 202. In addition, since the CSs 200, 202 are removed in the direction of thickness thereof, the CS removing operation can be finished in a shorter time than that needed when CSs are removed in a direction parallel to the plane of each CS. Moreover, since two CSs 200, 202 can be simultaneously removed, the present system 8 can enjoy improved operation efficiency.

Meanwhile, in the CS mounting device 26, the downward movement of the CS-carry-in CS holding device 28 is started. As previously described, this downward movement is started when the main CS-holding device 20 reaches the CS removing position. After the main CS-holding device 20 reaches the CS mounting position, the main CS-holding device 20 is moved downward to its CS-mounting height position at a low speed, which contributes to reducing the impact exerted to the CSs 200, 202. Although the downward movement of the CS holding device 28 is performed at the low speed, the total time needed for transferring the CSs 200, 202, 210, 212 is not increased, because the downward movement is performed concurrently with the removing of the CSs 200, 202. Since in the present embodiment the CS mounting position and the CS removing position are remote from each other, the operation at the CS mounting position and the operation at the CS removing position can be performed concurrently.

Figure 7:
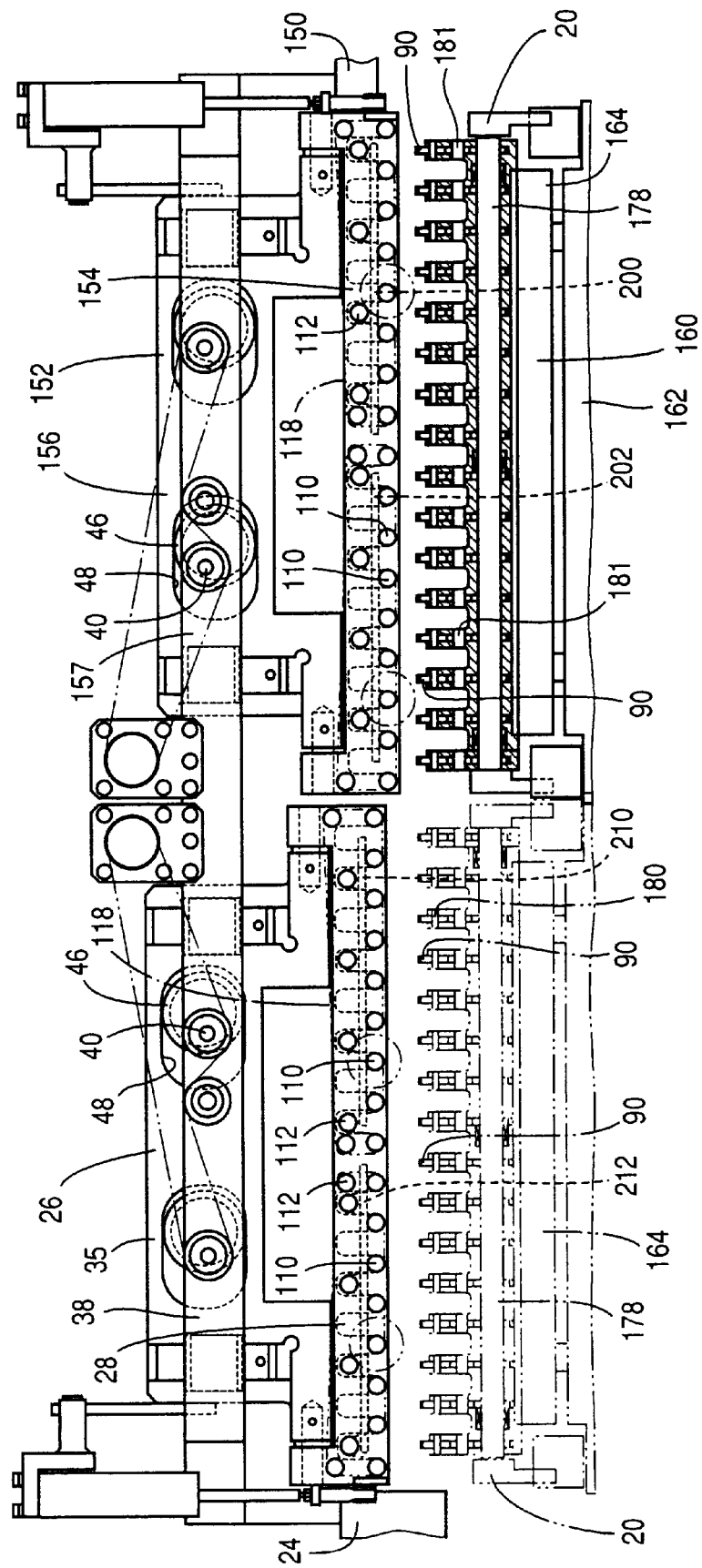
FIG. 7 is a view showing yet another operation state of the CC mounting system of FIG. 1.

At the fourth and fifth steps shown in FIG. 8, the main CS-holding device 20 is lowered to its horizontal-movement height position and then is moved to its CS mounting position in a horizontal direction, as shown in FIG. 7. Since currently the main CS-holding device 20 is not holding any CSs, the downward and horizontal movements of the CS holding device 20 can be quickly performed with an abrupt acceleration and/or an abrupt deceleration. In the known CC mounting system 500 shown in FIG. 14, the main CS-holding portion 518 cannot be moved in the CS carrying direction. In contrast, in the present CC mounting system 8, the main CS-holding device 20 is moved in the CS carrying direction. Since, however, the CS holding device 20 can be quickly moved in the CS carrying direction as described above, the time needed for the movement of the CS holding device 20 is not increased so much.

The main CS-holding device 20 is lowered before being moved in the horizontal direction, because in the state shown in FIGS. 5 and 6 in which the main CS-holding device 20 and the CS-carry-out CS holding device 154 are at their CS removing positions, the clamp members 90 are accommodated in the recesses 88 of the pivotable members 82 and accordingly interfere with the horizontal movement of the CS holding device 20. In addition, since the CS holding device 154 is holding the CSs 200, 202 and the CS holding device 20 is not holding any CSs, the downward movement of the CS holding device 20 can be performed more quickly than the upward movement of the CS holding device 154, so that the horizontal movement of the CS holding device 20 can be started more rapidly.

After the CSs 200, 202 are removed from the CS supporting device 12, the upward movement of the CS-carryout CS holding device 154 holding the CSs 200, 202 is started. The CS holding device 154 is moved upward to the CS-transferring height position where the respective lower surfaces of the CSs 200, 202 held thereby are slightly higher than the upper surfaces of the conveyor belts of the CS HCO device 150. Since this upward movement is performed by utilizing the eccentric cams 46, the acceleration and deceleration of the upward movement at the lowermost and uppermost positions of the CS holding device 154 can be made small, which contributes to reducing the impact exerted to the CSs 200, 202 on which the CCs have been mounted, thereby effectively preventing the CCs from being moved out of position on the CSs 200, 202. Since this upward movement is performed concurrently with the horizontal movement of the main CS-holding device 20, the overall time needed for transferring the CSs 200, 202, 210, 212 is not increased although the upward movement is performed at a low speed.

When the main CS-holding device 20 is horizontally moved to its CS mounting position, the sixth step commences, and the main CS-holding device 20 is moved upward to its CS mounting height position. Thus, the clamp members 90 of the main CS-holding device 20 which are at their CS releasing position are accommodated in the recesses 88 of the pivotable members 82 of the CS-carry-in CS holding device 28, and the bottom surfaces of the recesses 182 of the main member 176 of the CS clamping devices 166, 168 engage the lower surfaces of the CSs 210, 212.

The seventh step is the CS mounting and CS carrying-out step. In the CS supporting device 12, the clamp members 90 are pivoted to their CS clamping position and, in the CS-carry-in CS holding device 28, the pivotable members 82 are pivoted to their CS releasing position. Thus, the two CSs 210, 212 are simultaneously mounted on the CS supporting device 12. The CSs 210, 212 are handed smoothly without being moved in the vertical direction, like when the CSs 200, 202 are handed for being removed from the CS supporting device 12. Thus, the impact exerted to the CSs 210, 212 is reduced. Therefore, even if the CSs 210, 212 which are carried in by the CS carry-in device 14 may have some CCs already mounted thereon, those CCs are prevented from being moved out of position on the CSs 210, 212. In addition, since the CSs 210, 212 are mounted on the CS supporting device 12 in the direction of thickness of each CS 210, 212, the time needed for mounting the same 210, 212 can be shortened. Moreover, the two CSs 210, 212 can be simultaneously mounted on the CS supporting device 12 while being positioned in the CS carrying direction.

Meanwhile, the CS removing device 152 starts the transferring of the CSs 200, 202 to the CS HCO device 150 in the horizontal direction parallel to the plane of each CS 200, 202. The drive motor 122 is started to rotate the rotatable support members 86 belonging to the downstream-side group 114, so that the CS 200 is transferred horizontally to the CS HCO device 150. Thereafter, both of the drive motors 124, 122 are operated to rotate all the rotatable support members 86 belonging to the upstream-side and downstream-side groups 116, 114, so that the CS 202 is transferred horizontally to the CS HCO device 150. The two CSs 200, 202 are transferred to the CS HCO device 150 in the order of description. Thus, during this horizontal movement of the CSs 200, 202, the CSs 200, 202 are effectively prevented from riding on each other. Since this horizontal transferring of the CSs 200, 202 are performed without involving the operation of the CS supporting device 12, the horizontal transferring of the CSs 200 202 can be performed concurrently with the mounting of the CSs 210, 212 and/or the mounting of CCs on the CSs 210, 212. The CSs 200, 202 transferred to the CS HCO device 150 are carried out by the same 150 in the horizontal direction parallel to the plane of each CS 200, 202.

The eighth and ninth steps are the CS carrying-out step. The CS-carry-in CS holding device 28 is moved upward, and the main CS-holding device 20 is moved from its CS mounting position to its CC mounting position. Since the CS-carry-in CS holding device 28 is not holding any CSs, the CS holding device 28 can be quickly moved up with an abrupt acceleration and/or an abrupt deceleration. At the CS receiving height position of the CS holding device 28, the pivotable members 82 of the same 28 are rotated to their CS holding position. Thus, the CS holding device 28 waits in a state in which the CS holding device 28 is ready for receiving the CSs carried in by the CS HCI device 24. Meanwhile, at the CS removing height position of the CS removing device 152, the pivotable members 82 of the same 152 are rotated to their CS releasing position. In this state, the CS-carry-out CS holding device 154 waits.

Figure 9:
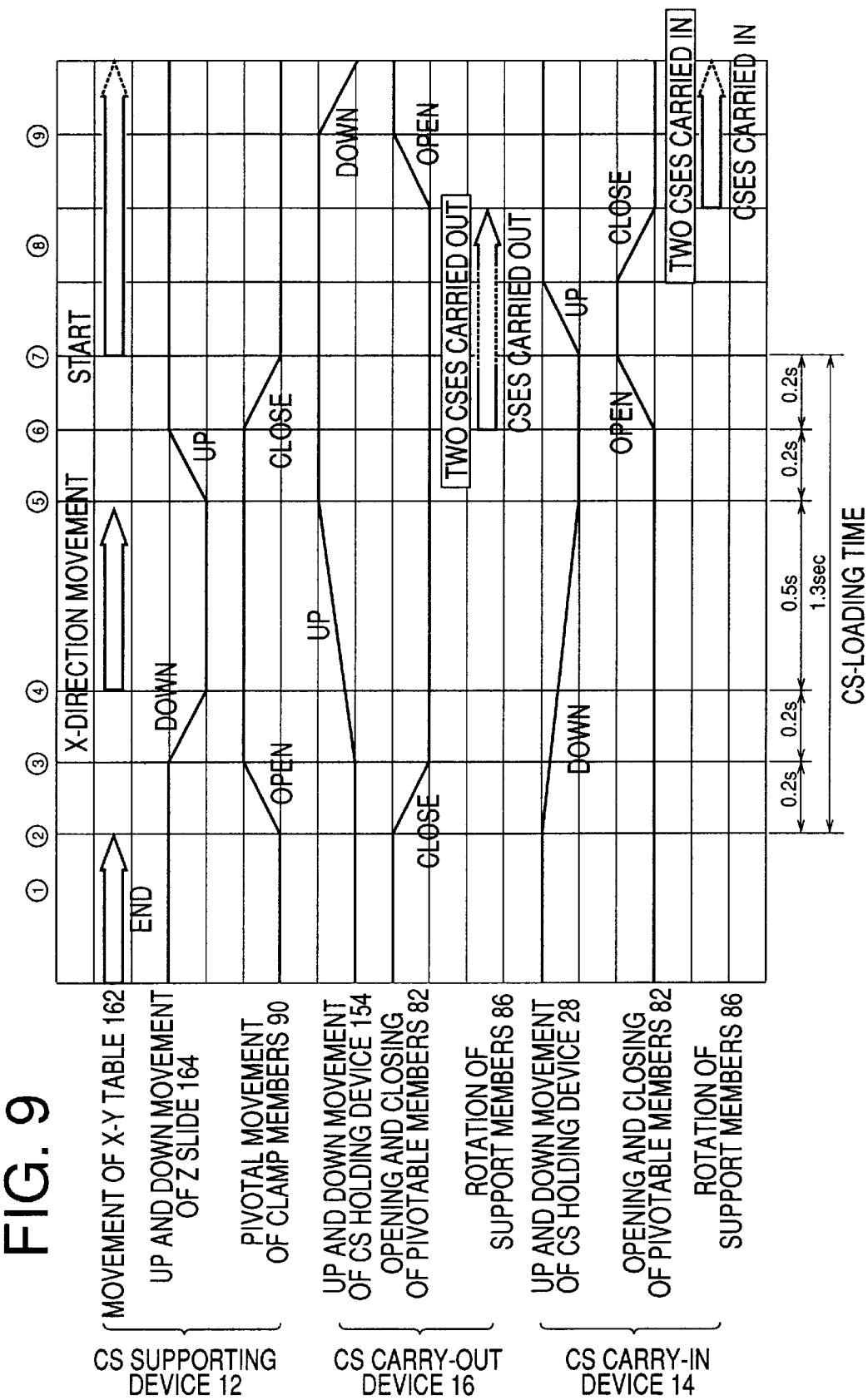
FIG. 9 is a time chart representing the steps of the operation of the CC mounting system of FIG. 1.

The present CC mounting system 8 mounts CCs on the CSs 200, 202, 210, 212 in the above-described manner. FIG. 9 shows that the present system 8 needs only 1.3 second to remove the two CSs 200, 202 from the CS supporting device 12 and mount the two CSs 210, 212 on the CS supporting device 12. Since the removing of the CSs 200, 202 and the mounting of the CSs 210, 212, i.e., the transferring of the CSs 200, 202, 210, 212 are performed in the direction of thickness of each CS 200, 202, 210, 212, the time needed for the transferring of the CSs 200, 202, 210, 212 can be shorter than a time that would be needed when the transferring is performed in the parallel direction parallel to the plane of each CS. Since the CS supporting device 12 can be freely moved during the thus saved time, the device 12 can enjoy improved operation efficiency, which leads to improving the operation efficiency of the present CC mounting system 8.

Recently, CSs which have a small dimension in the CS carrying direction are widely used in portable telephones. The present CC mounting system 8 can simultaneously transfer two CSs which have a small dimension in the CS carrying direction, and accordingly can enjoy improved operation efficiency.

The present CC mounting system 8 can mount CCs on each of various sorts of CSs which have different dimensions in the CS carrying direction and/or their width-wise direction perpendicular to the CS carrying direction. Depending upon the dimensions of the CSs, the distance between the pair of pivotable CS holding devices 32 and 33, or 158 and 159, or the pair of CS clamping devices 166 and 168 is adjustable in the CS mounting device 26, the CS removing device 152, or the main CS-holding device 20, respectively. Meanwhile, in the case where the present system 8 mounts CCs on CSs which have a great dimension in the CS carrying direction, both of the drive motors 122, 124 are constantly operated to rotate all the rotatable support members 86, when each CS is horizontally transferred from the CS HCI device 24 to the CS mounting device 26 and when each CS is horizontally transferred from the CS removing device 152 to the CS HCO device 150. Thus, the CSs which have a great dimension in the CS carrying direction can be transferred in the horizontal direction parallel to the plane of each CS. In this case, the upstream-side positioning device 136 remains kept at its upper or retracted position.

Figure 10:
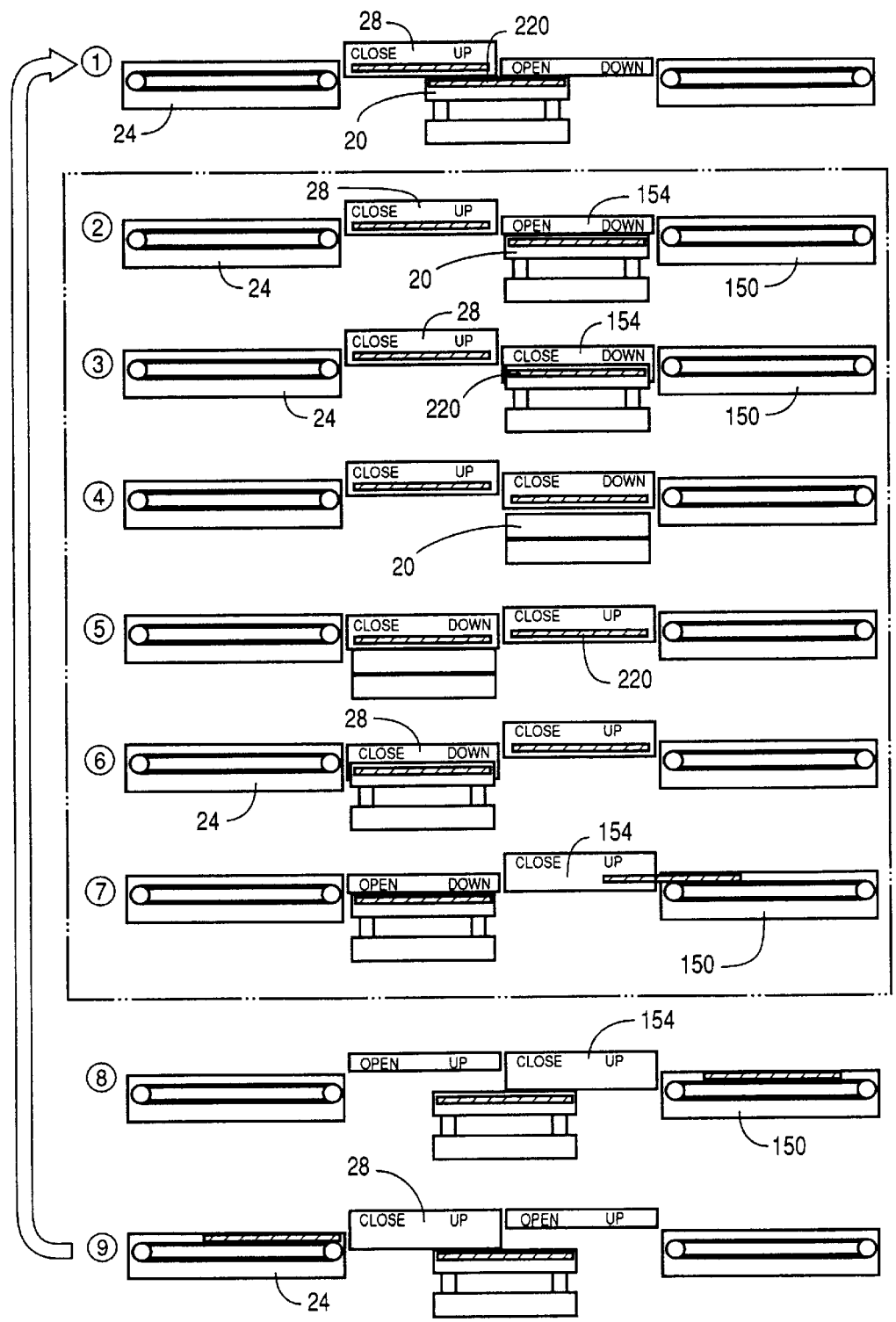
FIG. 10 is a view showing various steps of a different CS transferring operation of the CC mounting system of FIG. 1.
Figure 11:
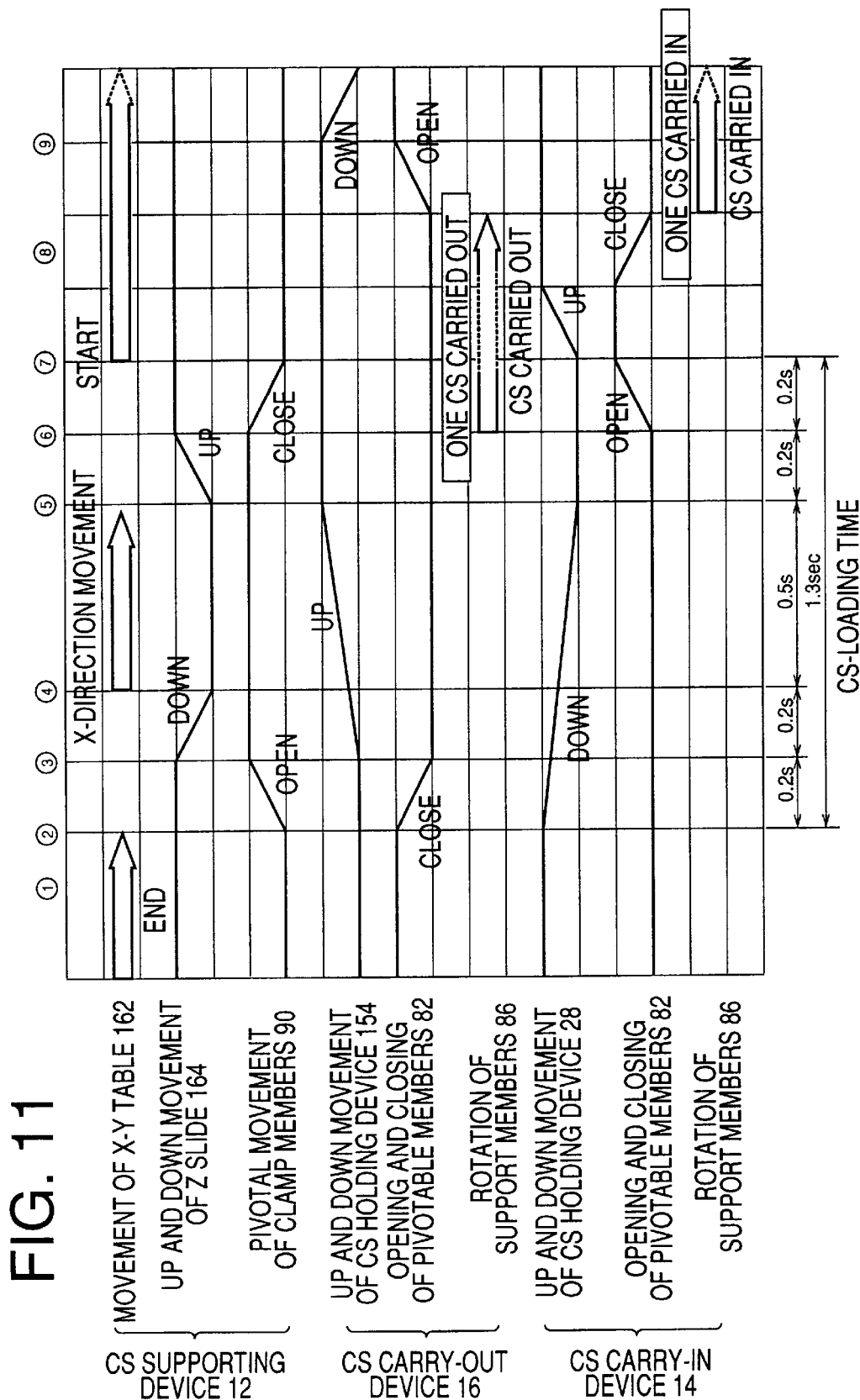
FIG. 11 is a time chart representing the steps of the different operation of the CC mounting system of FIG. 1.
Figure 15:
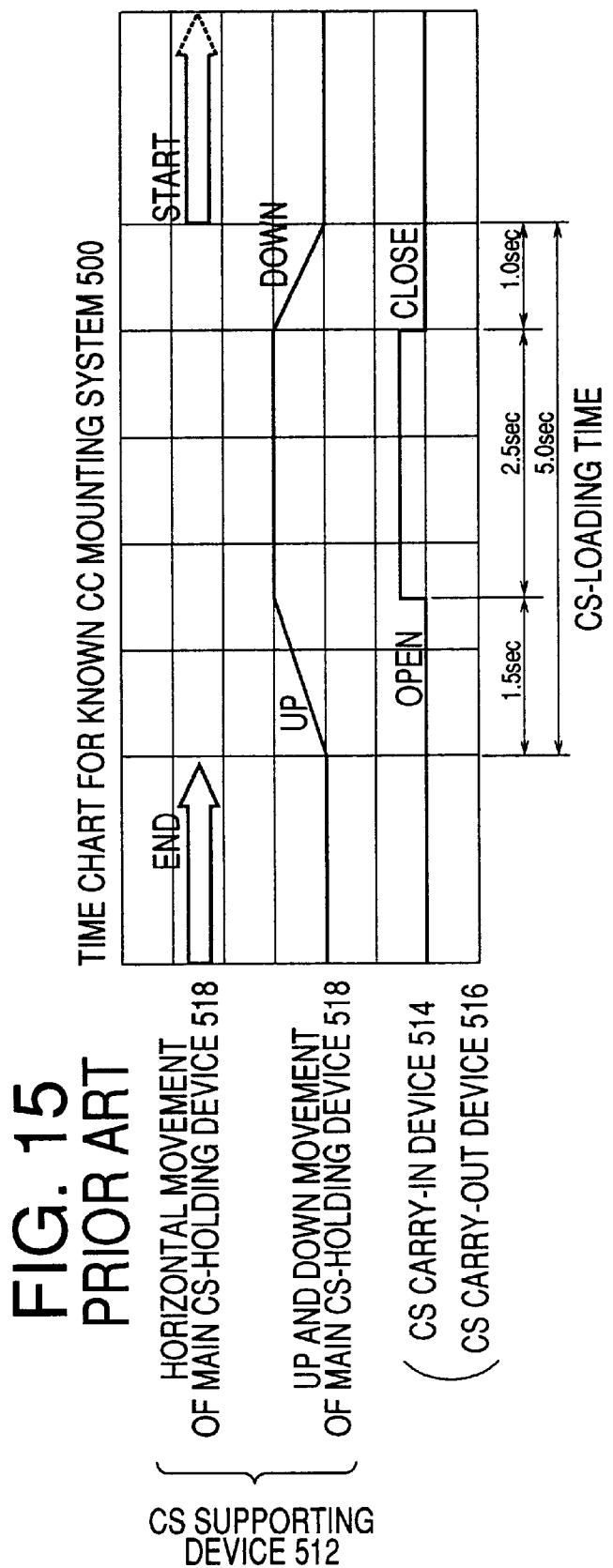
FIG. 15 is a time chart representing the steps of the operation of the known CC mounting system of FIG. 14.

FIG. 10 shows the steps of the operation for transferring a single CS 220 which have a great dimension in the CS carrying direction, and FIG. 11 shows the time chart of that operation. FIG. 11 indicates that the present CC mounting system 8 needs only 1.3 second to transfer the single CS 220. In contrast, FIG. 15 shows that the known CC mounting system 500 needs 5.0 seconds. Thus, the present system 8 can transfer each CS in about one third of the conventional time.

Figure 12:
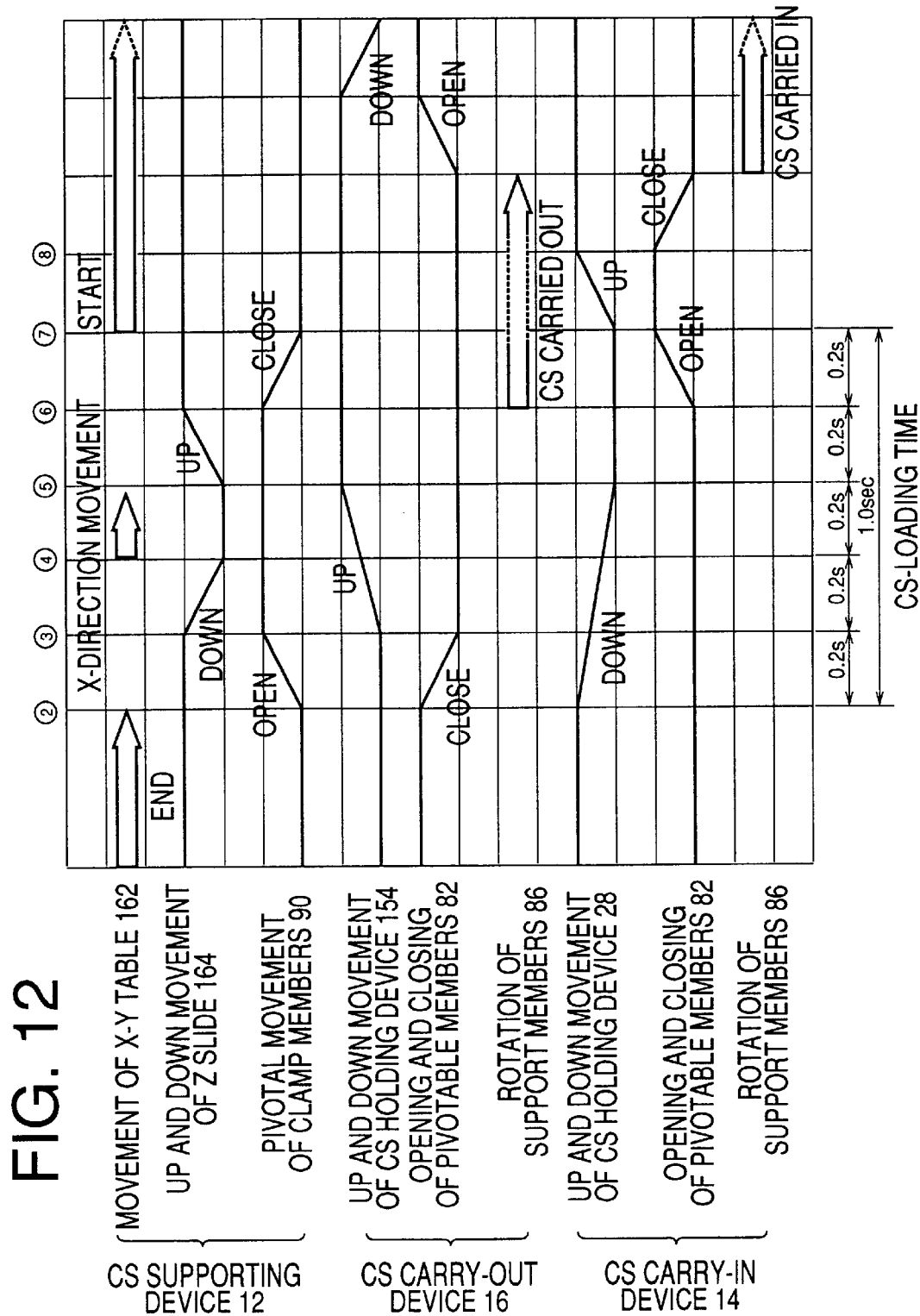
FIG. 12 is a time chart representing various steps of a different CS transferring operation of the CC mounting system of FIG. 1.

FIG. 12 shows the time chart of an operation for transferring a single CS which have a small dimension in the CS carrying direction. Since the CS can be held by any portion of each of the main CS-holding device 20, the CS-carry-in CS holding device 28, and the CS-carry-out CS holding device 154, the distance of horizontal movement of the main CS-holding device 20 can be shortened and accordingly the time needed for the horizontal movement can be shortened. Since the time needed for the horizontal movement can be shortened, the time needed for the downward movement of the CS-carry-in CS holding device 28 holding the CS from its CS receiving height position to its CS mounting height position can be shortened in comparison with the second to seventh steps shown in FIG. 10.

Thus, the present CC mounting system 8 can mount CCs on various sorts of CSs having different dimensions, while reducing the overall time needed for mounting and removing each sort of CS.

It is noted that the CS HCI device 24 and the CS HCO device 150 can be said as fixed or main conveyor devices and that the CS mounting device 26 and the CS removing device 152 can be said as movable or auxiliary conveyor devices.

Figure 14:
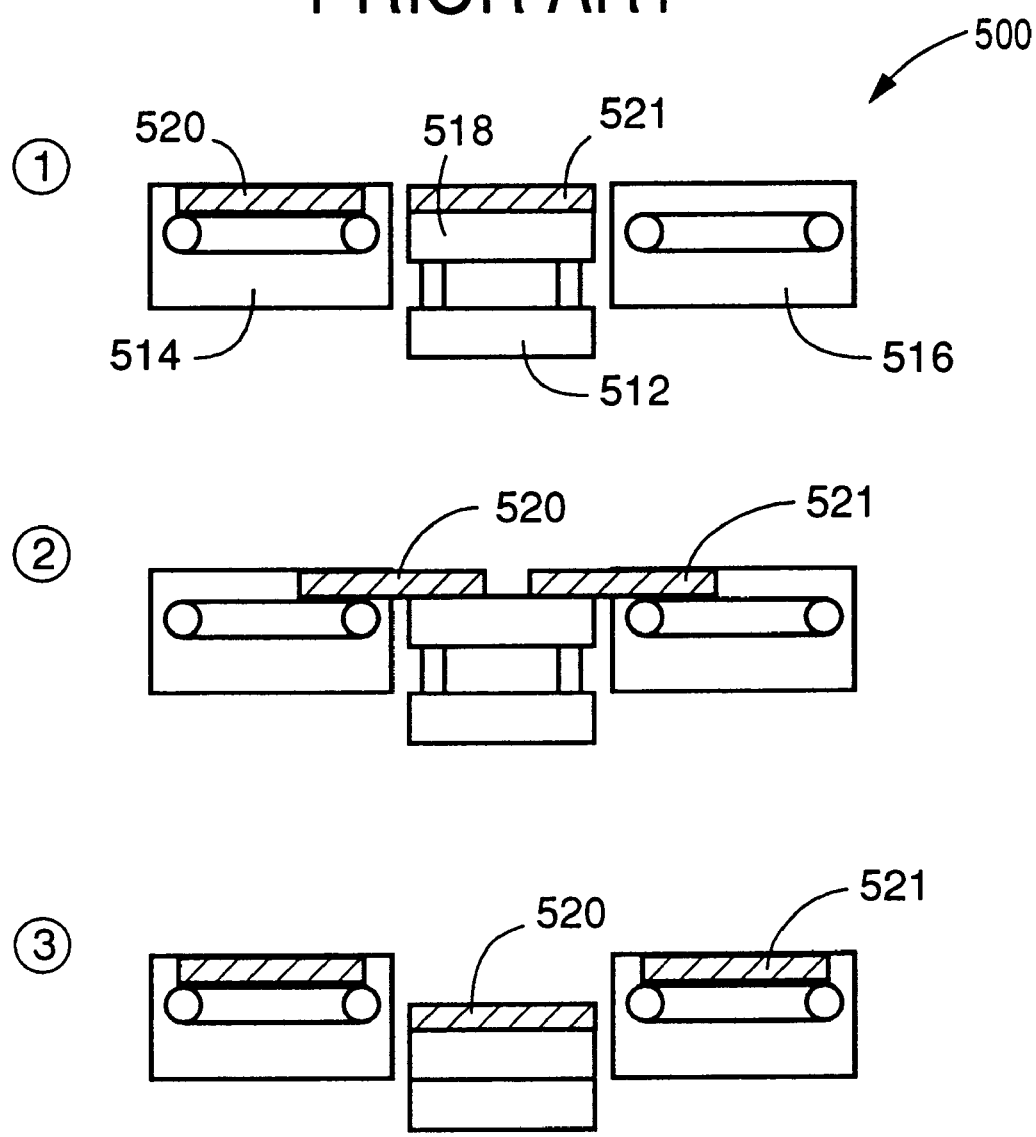
FIG. 14 is a view showing various steps of a CS transferring operation of a known CC mounting system.

In the illustrated embodiment, both the removing of one or two CSs from the CS supporting device 12 and the mounting of one or more CSs on the same 12 are performed in the direction of thickness of each CS. However, even in the case where the removing of one or two CSs from the CS supporting device 12 is performed in the direction of thickness of each CS but the mounting of one or more CSs on the same 12 is not performed in the direction of thickness of each CS, the overall time needed for transferring each CS can be shortened because, even in the known CC mounting system as shown in FIG. 14, the speed of horizontal transferring of the CS 520 from the CS carry-in device 514 to the CS supporting device 512 can be increased unlike the speed of horizontal transferring of the CS 521 from the CS supporting device 512 to the CS carry-out device 516, that is, because no CC or only a small number of CCs are mounted on the CS 520 which is transferred from the CS carry-in device 514 to the CS supporting device 512.

In the illustrated embodiment, two CSs are simultaneously mounted or removed. However, three or more CSs can be simultaneously mounted and removed, to further improve the operation efficiency of the CC mounting system 8. In this case, for example, the rotatable support members 86 are divided into three or more groups, so that each of the three or more groups of support members 86 may be rotated independent of the other groups.

In the illustrated embodiment, when the two CSs 200, 202 are transferred from the CS removing device 152 to the CS HCO device 150, the CSs 200, 202 are moved one by one in the horizontal direction. However, this manner is not essentially required. It is possible that the two CSs 200, 202 be simultaneously moved by operating both of the drive motors 122, 124, because it is not necessary to position the CSs 200, 202 in the CS carrying direction unlike in the case where the CSs 210, 212 are carried in. In the case where the two CSs 200, 202 are simultaneously moved, it is not necessary to group the rotatable support members 86 of the CS-carry-out CS holding device 154 into the upstream-side and downstream-side groups 114, 116.

In the illustrated embodiment, each of the CS-carry-in and CS-carry-out CS holding devices 28, 154 supports the lower surface of each CS, and the main CS-holding device 20 clamps each CS. However, at least one of the three CS holding devices 28, 154, 20 may be replaced by an air-suction device which holds each CS by applying air suction thereto.

In the illustrated embodiment, each of the CS-carry-in and CS-carry-out elevating and lowering devices 30, 156 employ the eccentric cams 46. However, each of the elevating and lowering devices 30, 156 may employ a hydraulic actuator for elevating and lowering a corresponding one of the CS-carry-in and CS-carry-out CS holding devices 28, 154. Since, in particular, the CS-carry-in elevating and lowering device 30 can more greatly accelerate and/or decelerate the upward and downward movements of the CS holding device 28 than the CS-carry-out elevating and lowering device 156, it is more advantageous for the elevating and lowering devices 30 to employ a hydraulic actuator in place of the eccentric cams 46.

In the illustrated embodiment, the CC mounting position is different from the CS mounting position and the CS removing position, and accordingly the main CS-holding device 20 must be able to move in the horizontal direction. However, the the CC mounting position may coincide with at least one of the CS mounting position and the CS removing position. In the latter case, at least one of the CS mounting device 26 and the CS removing device 152 is provided with a moving device which moves the CS holding device 28, 154 thereof to, and away from, the CC mounting or removing position.

In the illustrated embodiment, the CC mounting device 10 is provided with only the single camera 23 which reads the fiducial marks of each CS. However, two or more cameras 23 may be employed. In the case where two or more cameras 23 are provided in a direction parallel to the CS carrying direction, the cameras 23 can concurrently read the fiducial marks of two or more CSs, respectively. In the case where two or more cameras 23 are provided in a direction perpendicular to the CS carrying direction, the cameras 23 can simultaneously read two or more fiducial marks of each CS, respectively. In any case, the present CC mounting system 8 can read the fiducial mark or marks of each CS in a reduced time, and accordingly can shorten the time needed for mounting CCs on each CS.

The control manners or patterns shown in FIGS. 9, 11, and 12 are just examples. The present CC mounting system 8 can be operated according to different control patterns.

Figure 13:
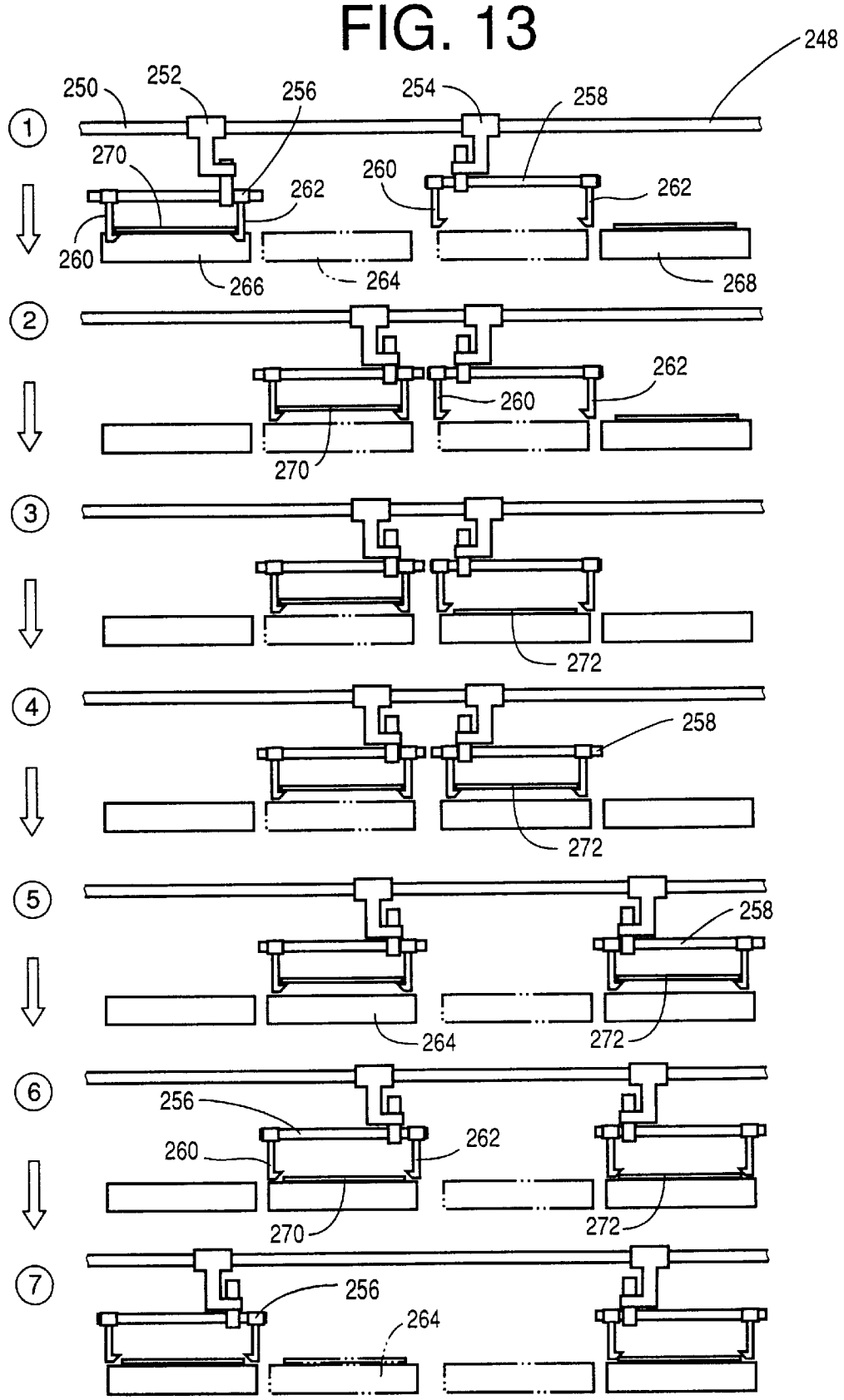
FIG. 13 is a view showing various steps of a CS transferring operation of another CC mounting system as a second embodiment of the present invention.

FIG. 13 shows a second embodiment of the present invention, which also relates to a CC mounting system. In the present CC mounting system 248, a CC carry-in device 250, 252 includes an elevating and lowering device for elevating and lowering a CS-carry-in CS holding device 256, and a CC carry-out device 250, 254 includes an elevating and lowering device for elevating and lowering a CS-carry-out CS holding device 258. However, a CS supporting device 264 does not include an elevating and lowering device for elevating and lowering a main CS-holding device (not shown) thereof. In addition, each of the CS-carry-in CS holding device 256 and the CS-carry-out CS holding device 258 is switchable to its CS holding state and its CS releasing state by utilizing horizontal movement, unlike the first embodiment wherein the pivotal motion of the pivotable members 82 is utilized for the same purpose. Moreover, the carrying-in of each CS in a horizontal direction parallel to the plane of the CS, and the mounting of the CS in a vertically downward direction perpendicular to the plane of the CS are performed by the single CS-carry-in CS holding device 256, and the removing of the CS in a vertically upward direction, and the carrying-out of the CS in the horizontal direction are performed by the single CS-carry-out CS holding device 258.

The instant CC mounting system 248 includes a guide member 250 which extends in a CS carrying direction, and two sliders 252, 254 each of which is guided by the guide member 250. The first slider 252 supports an end portion of the CS-carry-in CS holding device 256, such that the CS holding device 256 is movable upward and downward, and the second slider 254 supports an end portion of the CS-carry-out CS holding device 258, such that the CS holding device 258 is movable upward and downward.

Each of the CS-carry-in CS holding device 256 and the CS-carry-out CS holding device 258 includes a pair of holding members 260, 262 which are movable relative to each other in a horizontal direction. Each pair of holding members 260, 262 are movable toward each other to their CS holding position where respective holding hands thereof cooperate with each other to support a lower surface of a CS 270 and thereby hold the CS, and are movable away from each other to their CS releasing position where the two holding hands release the CS. Thus, each of the two CS holding devices 256, 258 is switchable to its CS holding and releasing positions. The distance between each pair of movable holding members 260, 262 positioned at their CS holding position is easily adjustable, depending upon the dimension of the CS in the CS carrying direction. Thus, each of the CS-carry-in and CS-carry-out CS holding devices 256, 258 can hold various sorts of CSs having different dimensions in the CS carrying direction. Thus, the adjusting of the distance between each pair of movable holding members 260, 262 positioned at their CS holding position, and the switching of each pair of movable holding members 260, 262 between their CS holding and releasing positions can be performed by a single drive source, which leads to reducing the production cost of the present CC mounting system 248.

Each of the CS-carry-in CS holding device 256 and the CS-carry-out CS holding device 258 can be elevated and lowered between its CS carrying height position where the CS is carried in the horizontal direction parallel to the plane thereof, and its CS transferring height position where the CS is transferred to, or from, the CS supporting device 264. Reference numerals 266, 268 designate a CS supplying device and a CS discharging device, respectively. The CS holding device 256 is horizontally moved between a CS receiving position and a CS mounting position, and the CS holding device 258 is horizontally moved between a CS removing position and a CS discharging position.

The CS supporting device 264 includes a main CS-holding device and a main-holding-device moving device (not shown) which are similar to the main CS-holding device 20 and the main-holding-portion moving device 22 of the first CC mounting system 8. The main CS-holding device of the device 264 is horizontally moved between the CC mounting position, the CS mounting position, and the CS removing position. The CS supporting device 264 does not include a device for elevating and lowering the main CS-holding device thereof, as described above.

In the first, second, and third steps shown in FIG. 13, the CS-carry-in CS holding device 256 holding the CS 270 is moved to the CS mounting position in the horizontal direction parallel the plane of the CS 270. Thus, the CS 270 is carried in from the CS supplying device 266. At the CS mounting position, the CS holding device 256 waits while holding the CS 270, i.e., waits in a state in which the CS holding device 256 is ready for mounting the CS 270 on the CS supporting device 264.

In addition, the CS-carry-out CS holding device 258 waits, at the CS removing position, in a state in which the CS holding device 258 is ready for removing the CS 270 from the CS supporting device 264, i.e., the pair of movable holding members 260, 262 are kept at their CS releasing position. Meanwhile, a CS 272 on which CCs have been mounted is moved to the CS removing position in a horizontal direction parallel to the plane of the CS 272.

In the fourth and fifth steps, the CS-carry-out CS holding device 258 is quickly moved downward to the CS removing height position, and the two movable holding members 260, 262 are moved toward each other to their CS holding position. CS clamping members (not shown) of the CS supporting device 264 are switchable to their CS releasing position. The CS holding device 258 removes, from the CS supporting device 264, the CS 272 in the direction of thickness thereof. Subsequently, the CS holding device 258 is slowly elevated, and the CS supporting device 264 is quickly moved to the CS mounting position in a horizontal direction. Before the CS supporting device 264 is moved horizontally, the CS holding device 258 is moved upward for preventing the holding members 260, 262 from interfering with the horizontal movement of the main CS-holding device of the supporting device 264.

In the sixth step, the CS-carry-in CS holding device 256 is slowly moved downward to the CS mounting height position, and the two movable holding members 260, 262 are moved away from each other to their CS releasing position. The clamp members of the CS supporting device 264 are switched to their CS clamping position. The CS holding device 256 mounts, on the CS supporting device 264, the CS 270 in the direction of thickness thereof. Subsequently, the CS holding device 256 is quickly elevated.

In addition, the CS-carry-out CS holding device 258 is moved horizontally to the CS discharging position, and the CS 272 is transferred from the CS holding device 258 to the CS discharging device 268, which then carries out the CS 272.

In the seventh step, the CS-carry-in CS holding device 256 is moved horizontally to the CS supplying position, and the CS supporting device 264 is moved horizontally to the CC mounting position.

As is apparent from the foregoing description, in the second embodiment shown in FIG. 13, the mounting and removing of the CSs 270, 272 are performed in the direction of thickness thereof, which contributes to reducing the overall time needed for transferring the CSs 270, 272. Since the CS supporting device 264 is not provided with a device for elevating and lowering the main CS-holding device thereof, as described above, the overall time needed for the second CC mounting system 248 to transfer the CSs 270, 272 may involve the time needed for lowering and elevating the CS-carry-in CS holding device 256 holding the CS 270 and the CS-carry-out CS holding device 258 holding the CS 272, and accordingly may be greater as such than that needed for the first CC mounting system 8 to perform the same operation. However, the transferring of the CSs 270, 272 is performed in the direction of thickness of each CS 270, 272, the second system 248 can receive the CS 270 and transfer the CS 272 in a still shorter time than that needed for the known CC mounting system 500 to perform the same operation. In addition, the carrying-in of the CS 270 in the horizontal direction and the mounting of the CS 270 in the direction of thickness thereof are performed by the single CS-carry-in CS holding device 256, and the removing of the CS 272 in the direction of thickness thereof and the carrying-out of the CS 272 in the horizontal direction are performed by the single CS-carry-out CS holding device 258. This arrangement leads to simplifying the construction of the CC mounting system 248.

In the second embodiment, the pair of holding members 260, 262 of each of the two CS holding devices 256, 258 hold the opposite end portions of each CS 270, 272, respectively, in the CS carrying direction. However, it is possible that each of the two CS holding devices 256, 258 be provided with a pair of holding members which hold the width-wise opposite end portions of each CS 270, 272. In addition, it is possible that at least one of the two CS holding devices 256, 258 be provided with a pair of pivotable CS-holding members which are similar to the pivotable members 82 of the first CC mounting system 8. The main CS-holding device of the CS supporting device 256 may be modified to support the lower surface of each CS 270, 272, in place of employing the CS clamping members which are similar to the clamp members 90 of the first system 8. In the latter case, the CS holding device 256 can mount each CS 70 on the main CS-holding device of the supporting device 264, by releasing the CS and thereby allowing the same to fall on the device 264. The CS supporting device 264 may be provided with a device for elevating and lowering the main CS-holding device thereof. In this case, the overall time needed for the second system 248 to transfer the CSs 270, 272 can be shortened to the same degree as that needed for the first system 8 to do so. In addition, in the last case, the two CS holding devices 256, 258 may be supported by the two sliders 252, 254, respectively, such that each CS holding device 256, 258 is not movable upward or downward.

In each of the first and second embodiments, each of the CS carry-in device 14, 250, 252, the CS carry-out device 16, 250, 254, the CS supporting device 12, 264, and the CC mounting device 10 may be modified as needed.

It is to be understood that the present invention may be embodied with other changes, improvements, and modifications that may occur to the person skilled in the art without departing from the scope and spirit of the invention defined in the appended claims.

What is claimed is:

1. A system for mounting circuit components on a circuit substrate, comprising:

a circuit-substrate supporting device which supports the circuit substrate;

a circuit-component mounting device which mounts, at a circuit-component mounting position, the circuit components on a surface of the circuit substrate supported by the circuit-substrate supporting device;

a circuit-substrate carry-out device which receives, from the circuit-substrate supporting device, the circuit substrate with the circuit components being mounted thereon, and carries out the received circuit substrate, wherein the circuit substrate is transferred from the circuit-substrate supporting device to the circuit-substrate carry-out device in a first direction substantially perpendicular to said surface of the circuit substrate; and a circuit-substrate carry-in device which carries in the circuit substrate and transfers the circuit substrate to the circuit-substrate supporting device, wherein the circuit substrate is transferred from the circuit-substrate carry-in device to the circuit-substrate supporting device in a second direction opposite to the first direction.

2. A system according to claim 1, wherein the circuit-substrate carry-out device comprises a removing device which removes, from the circuit-substrate supporting device, the circuit substrate with the circuit components being mounted thereon, at a circuit-substrate removing position, in the first direction; and a parallel-direction carry-out device which receives the circuit substrate removed by the removing device, and carries out the received circuit substrate by moving the received circuit substrate in a parallel direction substantially parallel to said surface of the circuit substrate.

3. A system according to claim 1, wherein the circuit-substrate carry-out device comprises a parallel-direction carry-out device which carries out the circuit substrate by moving the circuit substrate in a parallel direction substantially parallel to said surface of the circuit substrate; and a removing device which removes, from the circuit-substrate supporting device, the circuit substrate with the circuit components being mounted thereon, at a circuit-substrate removing position, in the first direction, and transfers the removed circuit-substrate to the parallel-direction carry-out device at a circuit-substrate transferring position in the parallel direction.

4. A system according to claim 1, wherein the circuit-substrate carry-in device comprises a third-direction carry-in device which carries in the circuit substrate by moving the circuit substrate to a circuit-substrate mounting position in a third direction substantially parallel to said surface of the circuit substrate; and a mounting device which receives, from the third-direction carry-in device, the circuit substrate moved to the circuit-substrate mounting position, and mounts the received circuit substrate on the circuit-substrate supporting device in the second direction.

5. A system according to claim 1, wherein the circuit-substrate carry-in device comprises a third-direction carry-in device which carries in the circuit substrate by moving the circuit substrate to a waiting position in a third direction substantially parallel to said surface of the circuit substrate; and a mounting device which holds the circuit substrate moved to the waiting position, waits while holding the circuit substrate, and mounts the circuit substrate on the circuit-substrate supporting device at a circuit-substrate mounting position in the second direction.

6. A system according to claim 1, wherein at least one of the circuit-substrate carry-out device, the circuit-substrate carry-in device, and the circuit-substrate supporting device comprises a holding device which holds the circuit substrate, and a holding-device moving device which moves the holding device in a third direction substantially parallel to said surface of the circuit substrate.

7. A system according to claim 1, wherein the circuit-substrate carry-in device and the circuit-substrate carry-out device are provided along a circuit-substrate carrying route, wherein the circuit-component mounting device is provided at the circuit-component mounting position offset from the circuit-substrate carrying route, wherein the circuit-substrate carry-in device comprises a mounting device which mounts, at a circuit-substrate mounting position on the circuit-substrate carrying route, the circuit substrate on the circuit-substrate supporting device in the second direction, wherein the circuit-substrate carry-out device comprises a removing device which removes, at a circuit-substrate removing position on a downstream side of the circuit-substrate mounting position on the circuit-substrate carrying route, the circuit substrate from the circuit-substrate supporting device in the first direction, and wherein the circuit-substrate supporting device comprises a main holding device which holds the circuit substrate, and a main-holding-device moving device which moves the main holding device to the circuit-component mounting position, the circuit-substrate mounting position, and the circuit-substrate removing position.

8. A system according to claim 1, wherein the circuit-substrate carry-in device and the circuit-substrate carry-out device are provided along a circuit-substrate carrying route, wherein the circuit-component mounting device is provided at the circuit-component mounting position offset from the circuit-substrate carrying route, and wherein the circuit-substrate supporting device comprises a main holding device which holds the circuit substrate, and a main-holding-device moving device which moves the main holding device in at least a direction which is substantially parallel to said surface of the circuit substrate and which intersects the circuit-substrate carrying route.

9. A system according to claim 1, comprising a circuit-substrate transferring device which transfers the circuit substrate in the first direction.

10. A system according to claim 9, wherein the circuit-substrate transferring device comprises at least one of a clamping device which clamps the circuit substrate, and a support member which supports a lower surface of the circuit substrate.

11. A system according to claim 1, wherein at least one of the circuit-substrate carry-out device, the circuit-substrate carry-in device, and the circuit-substrate supporting device comprises a holding device which holds the circuit substrate, and wherein the holding device comprises a pivot-type holding device comprising at least one main portion, and at least one pivotable portion which is supported by the main portion such that the pivotable portion is pivotable to a holding position where the pivotable portion supports a lower surface of the circuit substrate and thereby holds the circuit substrate, and to a releasing position where the pivotable portion releases the circuit substrate, about an axis line substantially parallel to said surface of the circuit substrate.

12. A system according to claim 11, wherein the at least one pivotable portion of the pivot-type holding device comprises at least one pivotable member which is attached to the at least one main portion such that the pivotable member is pivotable about an axis line thereof; and a plurality of rotatable support members which are attached to the pivotable member such that the rotatable support members are arranged along a straight line parallel to the axis line of the pivotable member and each of the support members is rotatable about an axis line perpendicular to the axis line of the pivotable member.

13. A system for mounting circuit components on a circuit substrate, comprising:
   a circuit-substrate supporting device which supports the circuit substrate;
   a circuit-component mounting device which mounts, at a circuit-component mounting position, the circuit components on a surface of the circuit substrate supported by the circuit-substrate supporting device; and
   a circuit-substrate carry-out device which receives, from the circuit-substrate supporting device, the circuit substrate with the circuit components being mounted thereon, and carries out the received circuit substrate, wherein the circuit substrate is transferred from the circuit-substrate supporting device to the circuit-substrate carry-out device in a first direction substantially perpendicular to said surface of the circuit substrate, and wherein at least one of the circuit-substrate carry-out device and the circuit-substrate supporting device comprises a holding device which holds the circuit substrate, and wherein the holding device comprises at least one main member; at least one pivotable member which is supported by the main member such that the pivotable member is pivotable about an axis line substantially parallel to said surface of the circuit substrate; a plurality of rotatable support members which are attached to the pivotable member such that the rotatable support members are arranged along a straight line parallel to the axis line of the pivotable member and each of the support members is rotatable about an axis line perpendicular to the axis line of the pivotable member; and a pivoting device which pivots the pivotable member to a holding position where the rotatable support members support the circuit substrate, and to a releasing position where the support members release the circuit substrate.

14. A system according to claim 12, wherein the pivot-type holding device further comprises a rotating device which rotates the rotatable support members, and wherein each of the rotatable support members includes a roller portion which contacts and supports the circuit substrate, and a friction ring defining an outer circumferential surface of the roller portion.

15. A system according to claim 14, wherein the rotating device comprises a plurality of driven pulleys each of which is attached to a portion of a corresponding one of the rotatable support members which portion is axially remote from the roller portion of said one rotatable support member; at least one guide pulley which is rotatably attached to the pivotable member such that the guide pulley is positioned in a plane in which the driven pulleys are positioned; a drive source which is attached to the pivotable member and which produces rotation; a drive pulley which is attached to the drive source such that the drive pulley is positioned in the plane; and a rotation transmitting member which is wound on the drive pulley, the driven pulleys, and the guide pulley.

16. A system for mounting circuit components on a circuit substrate, comprising:
   a circuit-substrate supporting device which supports the circuit substrate;
   a circuit-component mounting device which mounts, at a circuit-component mounting position, the circuit components on a surface of the circuit substrate supported by the circuit-substrate supporting device;
   a circuit-substrate carry-out device which receives, from the circuit-substrate supporting device, the circuit substrate with the circuit components being mounted thereon, and carries out the received circuit substrate, wherein the circuit substrate is transferred from the circuit-substrate supporting device to the circuit-substrate carry-out device in a first direction substantially perpendicular to said surface of the circuit substrate; and
   a circuit-substrate transferring device which transfers the circuit substrate in the first direction, wherein the circuit-substrate transferring device comprises a clamping device which clamps the circuit substrate, and
   wherein the clamping device comprises at least one main member; a plurality of clamp members which are attached to the main member such that the clamp members are spaced from each other in a direction substantially parallel to said surface of the circuit substrate, and each of which is pivotable to a clamping position where said each clamp member clamps the circuit substrate, and to a non-clamping position where said each clamp member does not clamp the circuit substrate; and a pivoting device which pivots the clamp members to the clamping and non-clamping positions thereof.

17. A system according to claim 16, wherein the pivoting device comprises an axis member which is rotatable; and a plurality of rotation transmitting devices each of which transmits the rotation of the axis member to a corresponding one of the clamp members.

18. A system according to claim 11, wherein at least one of the circuit-substrate carry-in device and the circuit-substrate carry-out device comprises the pivot-type holding device, and wherein the circuit-substrate supporting device comprises a main holding device which holds the circuit substrate and the main holding device comprises a clamping device which clamps the circuit substrate.

19. A system according to claim 18, wherein the pivot-type holding device holds at least one first portion of an outer peripheral portion of the circuit substrate, and the clamping device clamps at least one second portion of the outer peripheral portion of the circuit substrate which is different from the first portion.

20. A system according to claim 12, wherein the at least one pivotable member of the pivot-type holding device has a plurality of recesses formed in a plurality of first portions thereof, respectively, which are different from a plurality of second portions thereof to which the plurality of rotatable support members are attached, respectively.

21. A system according to claim 18, wherein the clamping device comprises at least one support member which supports a lower surface of the circuit substrate, and a plurality of clamp members which clamp the circuit substrate and which are attached to a plurality of first portions of the support member, respectively, wherein the at least one pivotable portion of the pivot-type holding device comprises a plurality of holding projections which cooperate with each other to hold the circuit substrate, and wherein the support member further includes a plurality of second recessed portions which are different from the first portions thereof and which permit the holding projections to move thereinto to hold the circuit substrate.

22. A system according to claim 1, wherein at least one of the circuit-substrate carry-out device, the circuit-substrate carry-in device, and the circuit-substrate supporting device comprises a holding device which holds the circuit substrate, and an elevating and lowering device which moves the holding device upward and downward.

23. A system according to claim 22, wherein the elevating and lowering device comprises a control device including a speed control device which controls a speed of the upward and downward movement of the holding device such that the speed of the movement is smoothly increased when the movement is started, and is smoothly decreased when the movement is stopped.

24. A system according to claim 22, wherein the holding device comprises a pivot-type holding device comprising at least one main portion, and at least one pivotable portion which is supported by the main portion such that the pivotable portion is pivotable to a holding position where the pivotable portion supports a lower surface of the circuit substrate and thereby holds the circuit substrate, and to a releasing position where the pivotable portion releases the circuit substrate, about an axis line substantially parallel to said surface of the circuit substrate, and wherein the elevating and lowering device comprises a speed control device which controls a speed of the upward and downward movement of the holding device such that the speed of the movement is smoothly increased when the movement is started, and is smoothly decreased when the movement is stopped.

25. A system according to claim 23, wherein the elevating and lowering device comprises at least one main member, and wherein the speed control device comprises at least one rotatable axis member which is supported by the main member such that the axis member is rotatable at a constant speed; and a motion converting device which converts the constant-speed rotation of the axis member into the upward and downward movement of the holding device such that the speed of the movement is smoothly increased from zero and is smoothly decreased.

26. A system according to claim 25, wherein the elevating and lowering device further comprises at least one elevating and lowering member which holds the holding device, and wherein the motion converting device comprises at least one eccentric cam which is attached to the rotatable axis member such that the eccentric cam is eccentric to the axis member; and at least one elongate groove which is formed in the at least one elevating and lowering member such that the elongate groove is elongate in a third direction substantially parallel to said surface of the circuit substrate, and which is engaged with the at least one eccentric cam such that the elongate groove is substantially immovable relative to the eccentric cam in a vertical direction.

27. A system according to claim 1, wherein at least one of the circuit-substrate carry-in device and the circuit-substrate supporting device comprises a positioning device which positions the circuit substrate in a third direction substantially parallel to said surface of the circuit substrate.

28. A system according to claim 1, wherein the circuit-substrate carry-in device comprises a plurality of carrying-direction positioning devices each of which positions the circuit substrate in a circuit-substrate carrying direction in which the circuit substrate is carried.

29. A system according to claim 1, further comprising a control device which controls the circuit-component mounting device, the circuit-substrate supporting device, and at least one of the circuit-substrate carry-in device and the circuit-substrate carry-out device.

30. A system according to claim 29, wherein the circuit-substrate carry-in device comprises a third direction carry-in device which carries in the circuit substrate by moving the circuit substrate to a waiting position in a third direction substantially parallel to said surface of the circuit substrate; and a mounting device which holds the circuit substrate moved to the waiting position, waits while holding the circuit substrate, and mounts the circuit substrate on the circuit-substrate supporting device at the waiting position in the second direction, wherein the mounting device comprises a pivot-type holding device comprising at least one main portion, and at least one pivotable portion which is supported by the main portion such that the pivotable portion is pivotable to a holding position where the pivotable portion supports a lower surface of the circuit substrate and thereby holds the circuit substrate, and to a releasing position where the pivotable portion releases the circuit substrate, about an axis line substantially parallel to said surface of the circuit substrate, and wherein the control device includes waiting control means for keeping, at the waiting position, the pivotable portion at the holding position thereof.

31. A system according to claim 29, wherein the circuit-substrate carry-out device comprises a removing device which removes, from the circuit-substrate supporting device, the circuit substrate with the circuit components being mounted thereon, at a circuit-substrate removing position, in the first direction, wherein the removing device comprises a pivot-type holding device comprising at least one main portion, and at least one pivotable portion which is supported by the main portion such that the pivotable portion is pivotable to a holding position where the pivotable portion supports a lower surface of the circuit substrate and thereby holds the circuit substrate, and to a releasing position where the pivotable portion releases the circuit substrate, about an axis line substantially parallel to said surface of the circuit substrate, and wherein the control device includes waiting control means for keeping, at the circuit-substrate removing position, the pivotable portion to the releasing position thereof.

32. A system according to claim 1, wherein at least one of the circuit-substrate carry-out device and the circuit-substrate carry-in device comprises a holding device which holds the circuit substrate, and wherein the holding device comprises at least one main member; at least one pivotable member which is attached to the main member such that the pivotable member is pivotable about an axis line substantially parallel to said surface of the circuit substrate; a plurality of rotatable support members which are grouped into a first group and a second group and which are attached to the pivotable member such that the rotatable support members are arranged along a straight line parallel to the axis line of the pivotable member and each of the support members is rotatable about an axis line perpendicular to the axis line of the pivotable member; and a rotating device which selectively operates in a first mode in which the rotating device rotates the rotatable support members belonging to the first and second groups and in a second mode in which the rotating device rotates the rotatable support members belonging to the first group and does not rotate the rotatable support members belonging to the second group.

33. A system according to claim 1, wherein at least one of the circuit-substrate carry-out device, the circuit-substrate carry-in device, and the circuit-substrate supporting device comprises a holding device which holds the circuit substrate, and wherein the holding device comprises at least one holding member which holds the circuit substrate; and a switching device which switches the holding member to a holding position where the holding member holds the circuit substrate and to a releasing position where the holding member releases the circuit substrate.

34. A system according to claim 1, wherein at least one of the circuit-substrate carry-out device and the circuit-substrate carry-in device comprises an unswitchable-type holding device which comprises a plurality of rollers, a belt which is wound on the rollers, and a rotating device which rotates the rollers; and a switchable-type holding device which is switchable to a holding state in which the switchable-type holding device holds the circuit substrate and to a releasing state in which the switchable-type holding device releases the circuit substrate.

* * * * *